(12) United States Patent
Terauchi et al.

(10) Patent No.: US 6,655,990 B2
(45) Date of Patent: *Dec. 2, 2003

(54) METHOD OF SURFACE MOUNTING A CONNECTOR AND CONNECTOR

(75) Inventors: Hideaki Terauchi, Kawasaki (JP); Fumio Aoki, Kawasaki (JP); Kazuhiko Ota, Kawasaki (JP); Yasuhiro Teshima, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/557,251

(22) Filed: Apr. 24, 2000

(65) Prior Publication Data

US 2002/0076979 A1 Jun. 20, 2002

Related U.S. Application Data

(62) Division of application No. 09/057,660, filed on Apr. 9, 1998, now Pat. No. 6,081,998.

(30) Foreign Application Priority Data

Oct. 3, 1997 (JP) ............................................. 9-270765

(51) Int. Cl.[7] ............................................. H01R 13/60
(52) U.S. Cl. ........................ 439/567; 439/876; 439/943
(58) Field of Search ............................ 439/82, 83, 567, 439/886, 876, 943

(56) References Cited

U.S. PATENT DOCUMENTS

| | | | | |
|---|---|---|---|---|
| 4,209,217 A | * | 6/1980 | Gudaitis et al. | 439/372 |
| 4,436,358 A | * | 3/1984 | Coldren et al. | 439/83 |
| 4,632,475 A | * | 12/1986 | Tomita | 439/1 |
| 4,681,389 A | * | 7/1987 | Nakazawa et al. | 439/557 |
| 4,731,030 A | * | 3/1988 | Johnston | 439/10 |
| 4,802,860 A | * | 2/1989 | Kikuta | 439/79 |
| 4,826,442 A | * | 5/1989 | Douty et al. | 439/92 |
| 4,978,307 A | * | 12/1990 | Billman et al. | 439/83 |
| 5,112,235 A | * | 5/1992 | Enomoto et al. | 439/83 |
| 5,115,375 A | * | 5/1992 | Garay | 361/760 |
| 5,228,870 A | * | 7/1993 | Gorenc et al. | 439/567 |
| 5,344,327 A | * | 9/1994 | Brunker et al. | 439/108 |
| 5,575,663 A | * | 11/1996 | Broschard, III et al. | 439/79 |
| 5,586,008 A | | 12/1996 | Kozel et al. | |
| 5,586,882 A | * | 12/1996 | Hanson | 433/13 |

(List continued on next page.)

FOREIGN PATENT DOCUMENTS

| | | |
|---|---|---|
| JP | 60-087182 | 6/1985 |
| JP | 61-027030 | 2/1986 |
| JP | 5-347174 | 12/1993 |
| JP | 7-211409 | 8/1995 |

Primary Examiner—P. Austin Bradley
Assistant Examiner—Edwin A. León
(74) Attorney, Agent, or Firm—Katten Muchin Zavis Rosenman

(57) ABSTRACT

There is disclosed a method of surface mounting a connector which enables a connector to be automatically mounted while preserving reliability of soldered portions and without additionally providing a special apparatus. The connector is formed to be thick at a portion and thin at another portion with respect to an axis $C_1$. In surface mounting the connector on the printed circuit board, a hook member is inserted into a through hole formed in advance through the printed circuit board. Then, the reflow process is carried out on the printed circuit board whereby terminals of the chips including the lead pins are soldered. The printed circuit board is removed from a reflow furnace, and cooled, whereupon the hook member is bent toward a hooking portion side. This brings the hooking portion into engagement with the underside of the printed circuit board, whereby the connector is firmly fixed to the printed circuit board.

1 Claim, 22 Drawing Sheets

U.S. PATENT DOCUMENTS

| | | | |
|---|---|---|---|
| 5,632,649 A | * 5/1997 | Spangler | 439/567 |
| 5,731,958 A | 3/1998 | Kozel | |
| 6,080,012 A | * 6/2000 | Zhu et al. | 439/567 |
| 6,129,492 A | * 10/2000 | Uno | 411/161 |
| 6,132,247 A | * 10/2000 | Liou et al. | 439/567 |
| 6,139,362 A | * 10/2000 | Brown | 439/567 |
| 6,165,209 A | * 12/2000 | Patterson et al. | 606/159 |
| 6,290,443 B1 | * 9/2001 | Uno | 411/178 |
| 6,338,599 B1 | * 1/2002 | Uno | 15/236.06 |
| 6,409,523 B1 | * 6/2002 | Shih | 439/79 |

* cited by examiner

METHOD OF SURFACE MOUNTING A CONNECTOR AND CONNECTOR

This is a division of Ser. No. 09/057,660 filed Apr. 4, 1998, now U.S. Pat. No. 6,081,998.

BACKGROUND OF THE INVENTION b 1. Field of the Invention

The present invention relates to a method of surface mounting a connector on a printed circuit board, and a connector, and more particularly, to a method of surface mounting a connector by fixing the connector to a printed circuit board prior to reflow soldering, and a connector.

2. Description of the Related Art

In recent years, a system adapted to data communications comes to be placed in an environment equipped with a STM (Synchronous Transfer Mode) node, a remote access user receiving module, a fast IN (Intelligent Networks) service control node, and an ATM (Asynchronous Transfer Mode) node. A printed circuit board for each node, particularly one for the remote access user receiving module, has main component parts thereof mounted by the SMT (Surface Mount Technology) due to the necessity for mass production thereof. Of the main component parts, terminals of connectors for connecting the module are also surface mounted.

Conventionally, the surface mount is carried out by the following procedure: Soldering paste is printed on a printed circuit board. Each component chip is mounted on the printed circuit board printed with the soldering paste. The resulting printed circuit board is placed in a reflow furnace whereby the soldering paste is melted to solder the component chips.

FIGS. 22(A) and 22(B) show an example of the construction of a conventional connector for surface mount. FIG. 22(A) is a plan view of the connector, while FIG. 22(B) is a cross-sectional view take on line $X_0$-$X_0$ of FIG. 22(A). The connector 90 has a body 91, and a plurality of long lead pins 91a and a plurality of short lead pins 91b extending from the body 91. These lead pins 91a, 91b are placed on a pattern of a printed circuit board. Within the body 91, there are provided female terminals 91c, 91d each electrically connected to a corresponding one of the lead pins 91a, 91b. The female terminals 91c, 91d have male terminals inserted therein from a casing via respective through holes 91e, 91f of the body 91.

Further, the body 91 of the connector 90 has arms 92, 93 formed on opposite sides thereof for protection of the lead pins 91a, 91b. These arms 92, 93 are formed with rivet holes 92a, 93a.

The connector 90 constructed as above is first positioned on the printed circuit board such that the lead pins 91a, 91b are located on respective pads of the pattern. In this state, rivets are inserted through the rivet holes 92a, 93a, respectively, and the connector 90 is fixed to the printed circuit board by these rivets. After having the other chips mounted or placed thereon, the printed circuit board is placed in a reflow furnace to carry out the reflow process for soldering the chips to the printed circuit board.

Since the connector 90 is fixed to the printed circuit board by the rivets, there is no fear of displacement thereof before the soldering. The lead pins 91a, 91b receive downward urging forces so that they are positively brought into intimate contact with the pads. Further, after the printed circuit board is completed, male connectors are frequently inserted and removed from the connector 90 for inspection of quality thereof. However, breaking stress can be prevented from being applied to the soldered portions during the frequent inspections.

To meet the above-mentioned ends, various connectors other than the one having the construction illustrated in FIGS. 22(A) and 22(B) are manufactured. For instance, Japanese Laid-Open Patent Publication (Kokai) No. 5-347174 discloses a connector formed with arms having respective hook members on opposite sides thereof, the arms being fitted in respective cutouts formed in a printed circuit board to have the connector fixed to the printed circuit board. Japanese Laid-Open Patent Publication (Kokai) No. 7-211409 discloses a connector formed with a hook-shaped locking member and a hooking portion, for use with a printed circuit board formed with a locking hole and a cutout portion. The locking member and the hooking portion of the connector are fitted in the locking hole and the cutout portion of the printed circuit board, respectively, whereby the connector is fixed to the printed circuit board.

In the case of the connector shown in FIGS. 22(A) and 22(B), application of a force of approximately 200 grams is required to insert the rivets into the rivet holes 92a, 93a, respectively. However, an ordinary automatic component-mounting system is capable of exerting a small force of several tens grams for urging each chip to the printed circuit board. Therefore, conventionally, the rivets are required to be inserted into the respective rivet holes by manual operations, which leads to a degraded productivity. Although it is also possible to provide a dedicated apparatus for the riveting, this leads to a large increase in the manufacturing cost and hence is not practical.

On the other hand, the connectors disclosed in Japanese Laid-Open Patent Publication (Kokai) Nos. 5-347174 and 7-211409 cannot have their above-mentioned fixing members properly fitted merely by placing the connectors on the respective printed circuit boards, and hence after all, manual operations are required in the surface mounting.

SUMMARY OF THE INVENTION

It is an object of the invention to provide a method of surface mounting a connector, which enables the connector to be automatically mounted while preserving reliability of soldered portions without additionally providing a special apparatus, as well as a connector.

To attain the above object, the present invention provides a method of surface mounting a connector on a printed circuit board. The method of surface mounting the connector on the printed circuit board comprises the steps of inserting a hook member formed on the connector, for fixing the connector, into a through hole formed through the printed circuit board, for insertion of the hook member, and bringing the connector into intimate contact with the printed circuit board by deforming the hook member by heat generated for reflow soldering.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 1(A) and 1(B) are diagrams which are useful in specifically describing a method of surface mounting a connector according to a first embodiment of the invention, in which FIG. 1(A) shows the connector with a hook member thereof inserted through a printed circuit board, and FIG. 1(B) shows the connector with the hook member inserted through the printed circuit board, in a state in which the reflow process has been carried out;

FIGS. 6(A) and 6(B) are diagrams which are useful in describing actions of the hook member of the connector according to the second embodiment, in which FIG. 6(A) shows the hook member inserted through a printed circuit board, and FIG. 6(B) shows the hook member inserted through the printed circuit board, in a state in which the reflow process has been carried out;

FIGS. 7(A) and 7(B) are diagrams showing the construction of a hook member of a connector according to a third embodiment of the invention, in which FIG. 7(A) is a side view of the connector having the hook member, and FIG. 7(B) shows a deformed shape which the hook member takes during a mounting operation;

FIGS. 8(A) and 8(B) are diagrams which are useful in describing a method of surface mounting a connector, according to a fourth embodiment of the invention, in which FIG. 8(A) is a front view schematically showing the connector with a hook member in its original shape, and FIG. 8(B) is a front view showing the hook member in its state during a mounting operation;

FIGS. 9(A) and 9(B) are diagrams showing the construction of a connector according to a fifth embodiment of the invention, in which FIG. 9(A) is a side view of the connector, and FIG. 9(B) is a front view of the connector as viewed from a connecting surface side;

FIGS. 10(A) and 10(B) are diagrams which are useful in describing a method of surface mounting a connector, according to a fifth embodiment of the invention, in which FIG. 10(A) shows the connector which is about to be mounted on a printed circuit board, and FIG. 10(B) shows the connector having been mounted on the printed circuit board;

FIGS. 11(A) and 11(B) are diagrams which are useful in describing a method of surface mounting a connector, according to a sixth embodiment of the invention, in which FIG. 11(A) is a plan view showing the construction of a portion of a printed circuit board on which the connector is mounted, and FIG. 11(B) shows the connector having been mounted on the printed circuit board;

FIGS. 13(A) and 13(B) are diagrams which are useful in describing a method of mounting a connector according to a seventh embodiment of the invention, in which FIG. 13(A) shows the construction of a portion of a printed circuit board, and FIG. 13(B) shows the connector having been mounted on the printed circuit board;

FIGS. 14(A) and 14(B) are diagrams showing the construction of a connector according to an eighth embodiment of the invention, in which FIG. 14(A) is a plan view of the connector, and FIG. 14(B) shows details of a configuration of a lead pin;

FIGS. 15(A) and 15(B) are diagrams which are useful in describing a method of mounting the lead pin of the connector according to the eighth embodiment, in which FIG. 15(A) is a plan view showing the construction of a portion of the printed circuit board on which the lead pin is mounted, and FIG. 15(B) is a cross-sectional view showing the lead pin having been actually mounted on the printed circuit board;

FIGS. 16(A) and 16(B) are diagrams showing variations of the lead pin of the connector according to the eighth embodiment, respectively, in which FIG. 16(A) shows a first variation, and FIG. 16(B) shows a second variation;

FIGS. 17(A) and 17(B) are diagrams which are useful in describing a method of soldering the lead pins shown in FIGS. 16(A) and 16(B), respectively, in which FIG. 17(A) is a plan view showing the construction of a land portion of a printed circuit board to which the lead pin is soldered, and FIG. 17(B) is a cross-sectional view showing the lead pin having been actually soldered;

FIGS. 19(A) and 19(B) are diagrams showing the construction of a connector according to a tenth embodiment of the invention, in which FIG. 19(A) is a plan view of the connector, and FIG. 19(B) is a side view showing the connector having been mounted on a printed circuit board;

DESCRIPTION OF THE PREFERRED EMBODIMENTS

Figure 2A:
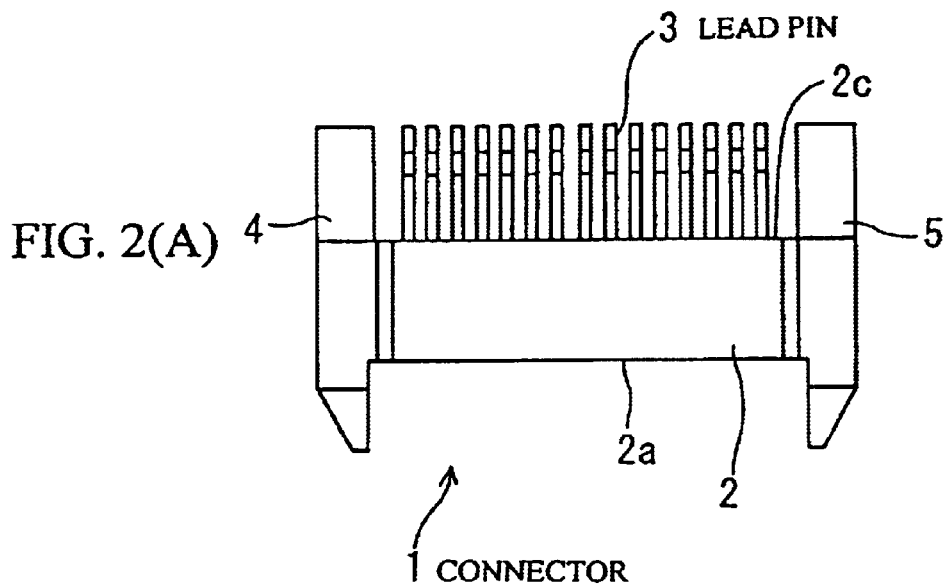
FIG. 2(A) is a plan view showing an appearance of the connector according to the first embodiment.
Figure 2B:
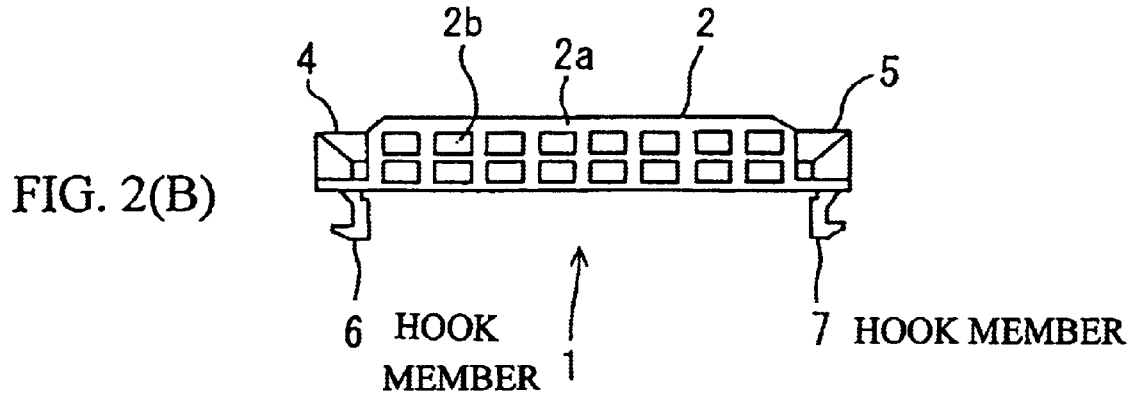
FIG. 2(B) is a front view showing an appearance of the connector, as viewed from a connecting surface side, according to the first embodiment.

The invention will now be described in detail with reference to drawings showing preferred embodiments thereof Referring first to FIGS. 2(A) and 2(B), there are shown appearances of a connector according to a first embodiment of the invention. FIG. 2(A) is a plan view of the connector, while FIG. 2(B) is a front view of the same as viewed from a mounting surface side. The connector 1 for surface mount has a body 2 which is formed of a synthetic resin and has a connecting surface 2a thereof formed with insertion holes 2b into which pins of a male connector to be connected are inserted. On the other hand, a large number of lead pins 3 extend from a surface 2c on an opposite side of the connector 1 to the connecting surface 2a side.

Further, the body 2 has arms 4 and 5 integrally formed therewith at respective opposite lateral sides thereof. The arms 4 and 5 which are formed of synthetic resin have hook members 6 and 7 integrally formed therewith at respective undersides thereof.

Figure 3:
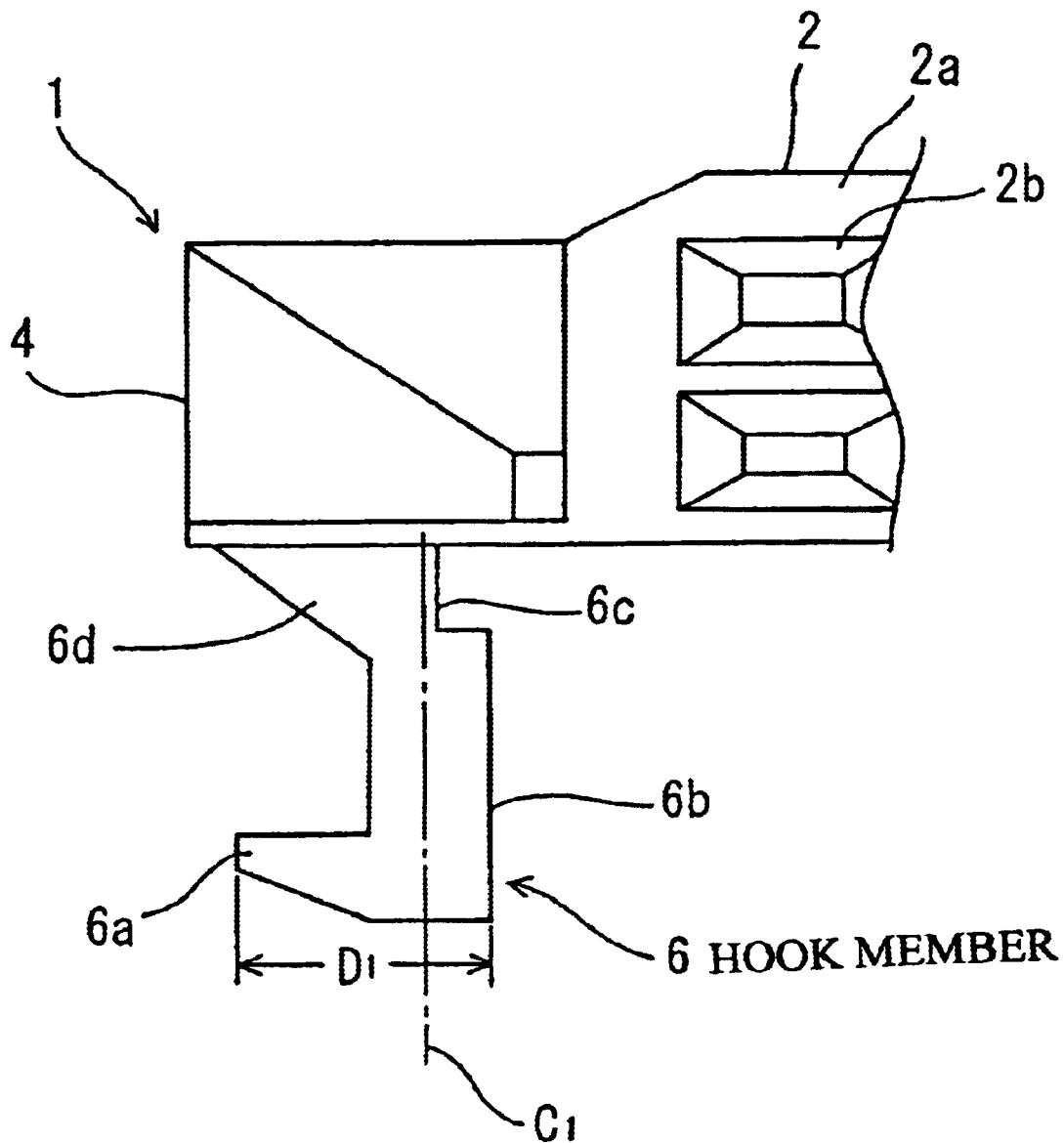
FIG. 3 is a diagram showing details of a configuration of a hook member of the connector according to the first embodiment.

FIG. 3 shows details of a configuration of the hook member 6 of the connector 1 according to the first embodiment. The hook member 6 has a hooking portion 6a integrally formed with a shaft portion 6b such that the hooking portion 6a protrudes outward from the shaft portion 6b. The hook member 6 has a root portion formed asymmetrical in thickness with respect to a center line $C_1$ of the shaft portion 6b. More specifically, the root portion is formed to be thin at a portion 6c on a side remote from the hooking portion 6a, and thick at a portion 6d on the same side as the hook member. Further, the hook member 6 is formed to have an overall width $D_1$ slightly shorter than the diameter of a through hole formed through a printed circuit board on which the connector 1 is to be mounted.

It should be noted that the hook member 7 is substantially identical in configuration and material to the hook member 6 except that the former has a hooking portion protruding in a direction opposite to the direction in which the hooking portion of the latter protrudes, and hence description details of the hook is omitted.

Next, a method of mounting the connector 1 having the hook members 6 and 7 formed as described above on a printed circuit board will be described.

Figure 1A:
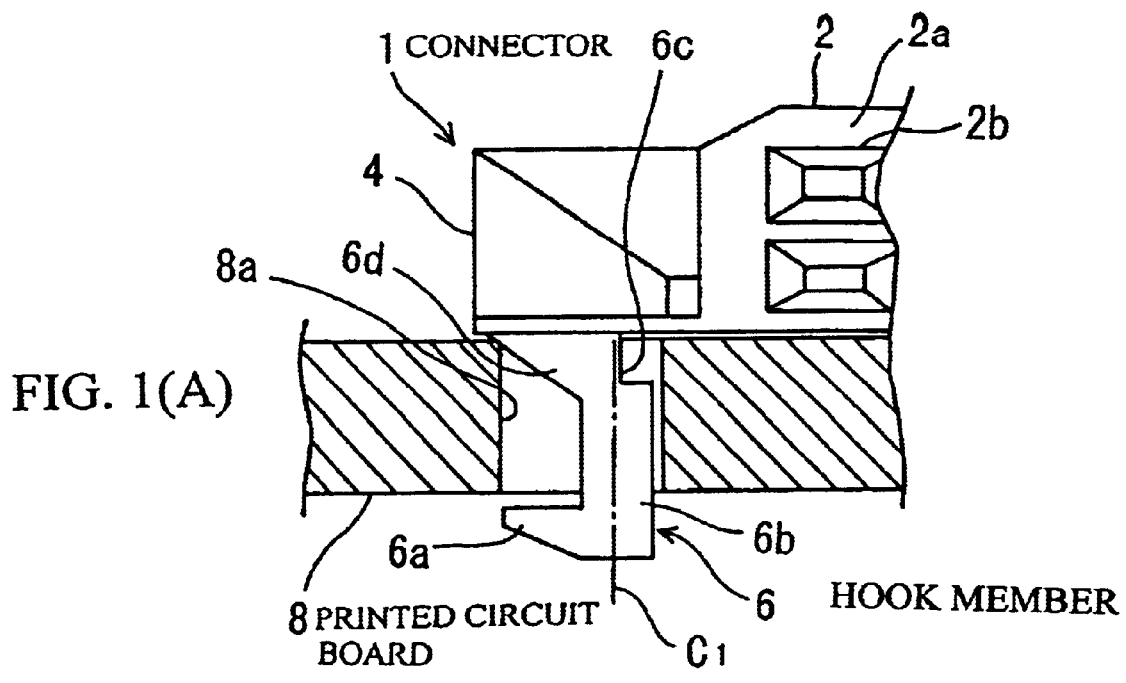
Figure 1B:
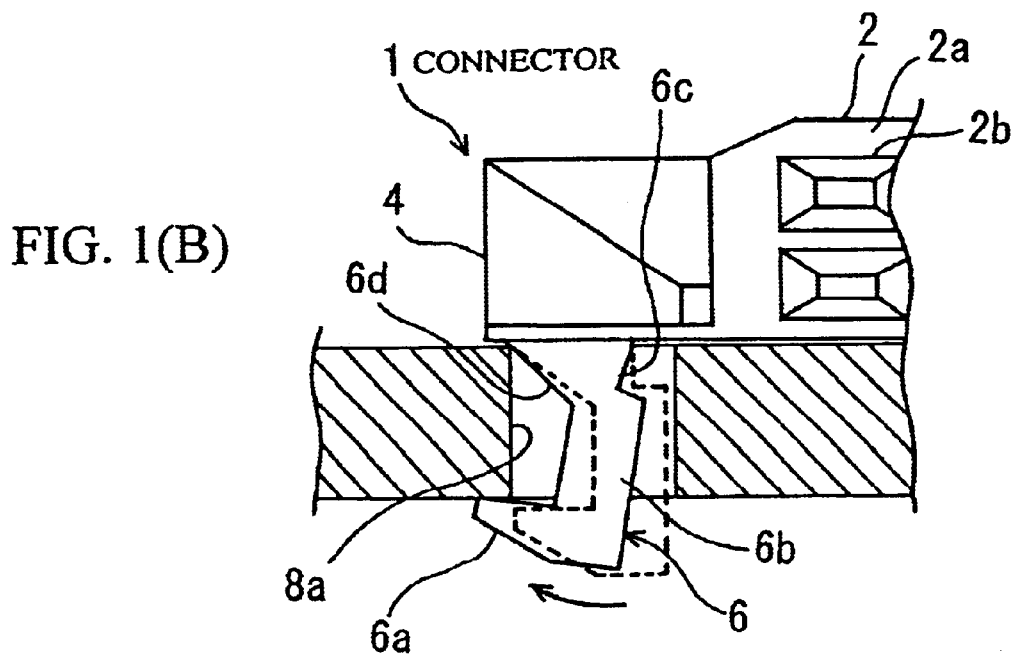

FIGS. 1(A) and 1(B) are diagrams which are useful in specifically describing the method of surface mounting the connector 1 according to the first embodiment. FIG. 1(A) shows the connector 1 and the printed circuit board 8 in a sate in which the hook member 6 of the connector 1 has been inserted through the printed circuit board 8, while FIG. 1(B) shows the same in a state in which the reflow process has been carried out. In surface mounting the connector 1 on the printed circuit board 8, as shown in FIG. 1(A), the hook member 6 is inserted through a through hole 8a formed in advance through the printed circuit board 8. Since the width $D_1$ of the hook member 6 is formed to be slightly shorter than the diameter of the through hole 8a, the hook member 6 can be easily inserted through the through hole 8a. Further, when the hook member 6 has been inserted, it projects from the underside of the printed circuit board 8 to an appropriate extent. Similarly to the hook member 6, the hook member 7 is also inserted through a through hole, not shown, of the printed circuit board. Thus, the connector 1 is placed on the printed circuit board 8. Through insertion of the hook members 6 and 7 in the respective through holes, the connector 1 is accurately positioned, which causes the lead pins 3 to be easily and accurately positioned.

When chips other than the connector 1 have been also mounted on the printed circuit board 8, the printed circuit board 8 is placed in a reflow furnace, where it is heated to a temperature of approximately 200° C. This melts the soldering paste to thereby effect soldering of terminals of the chips including the lead pins 3.

Further, although the hook members 6 and 7 are heated during this process, they undergo hardly any change in shape. However, when the printed circuit board 8 is removed from the reflow furnace for cooling, the hook member 6 is deformed as shown in FIG. 1(B) such that it is bent toward the hooking portion 6a side. This is because the hook member 6 is formed to be asymmetrical in thickness with respect to the center line $C_1$, so that the portion 6d which is thick is slower in cooling than the portion 6c which is thin, and generally a portion being cooled to contract attracts a portion therearound which has already been cooled.

This forces the hooking portion 6a into engagement with the underside of the printed circuit board 8 whereby the connector 1 is more reliably fixed to the printed circuit board 8. The hook member 7 also acts in the same manner.

As described above, according to the present embodiment, the width of the hook member 6 is made smaller than the diameter of the through hole 8a of the printed circuit board 8, which enables the connector 1 to be automatically mounted by a conventional component-mounting apparatus on the printed circuit board 8 without providing a dedicated apparatus for surface mounting the connector 1 whereby it is possible to reduce the cost of mounting the connector 1 on the printed circuit board 8 and attain enhanced productivity since no manual operations are required.

Further, since the whole hook member 6 is caused to be deformed such that it is bent toward the hooking portion 6a side, the connector 1 can be more firmly fixed to the printed circuit board 8, which eliminates undesired load on soldered portions, which is applied when a male connector is inserted and removed therefrom for quality inspection, etc. This improves the durability of the connector.

Next, an example of construction of the printed circuit board 8, which permits the first embodiment to be more effectively put into practice, will be described.

Figure 4A:
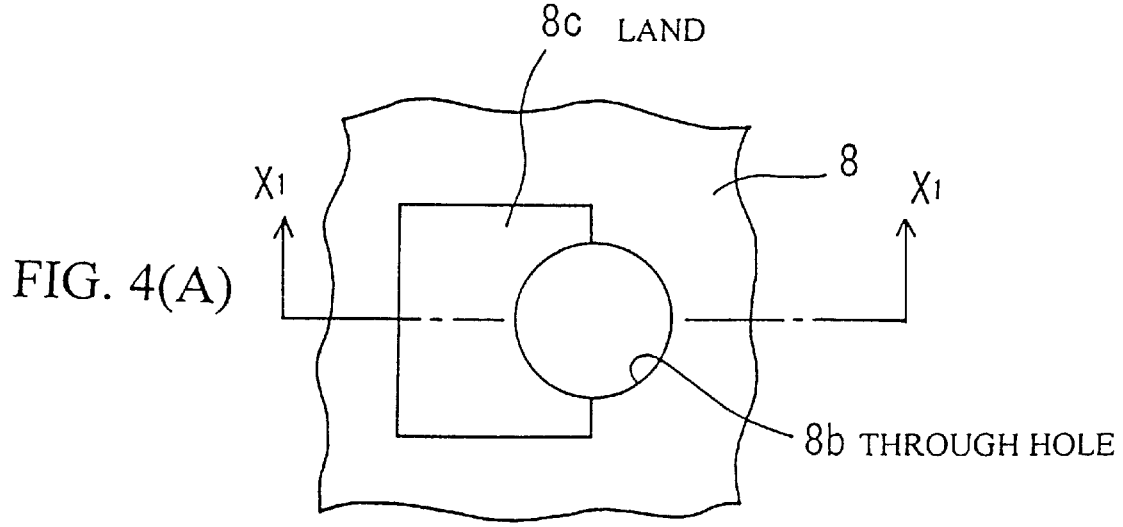
FIG. 4(A) is a plan view showing an example of construction of a portion of a printed circuit board on which the connector according to the first embodiment is mounted.
Figure 4B:
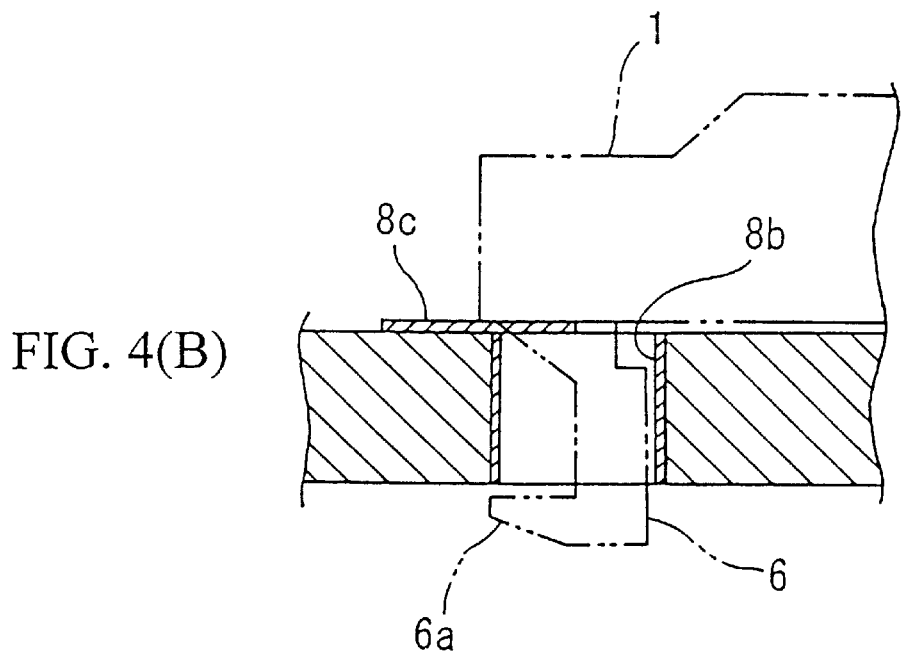
FIG. 4(B) is a cross-sectional view showing the example of construction of the portion of the printed circuit board on which the connector according to the first embodiment is mounted, taken on line $X_1$—$X_1$ of FIG. 4(A)

FIGS. 4(A) and 4(B) show the example of construction of the printed circuit board on which the connector 1 according to the first embodiment is mounted. FIG. 4(A) is a plan view of a portion of the printed circuit board, while FIG. 4(B) is a cross-sectional view of the same taken on line $X_1$—$X_1$ of FIG. 4(A). In the illustrated example, the printed circuit board 8 is formed with a through hole 8b for having the hook member 6 or the like of the connector 1 inserted therein. Further, a land 8c is formed adjacent to the through hole 8b in a fashion continuous therewith, however, such that a substantially half portion of the land 8c on a hooking portion 6a side extends to surround part of the opening of the through hole 8b.

Soldering paste is applied to the land 8c formed as describes above, the hook member 6 is inserted into the through hole 8b, and then reflow soldering is carried out. This manner of reflow soldering enables a larger amount of heat to be transmitted to the root portion of the hook member 6, whereby the hook member 6 can be more positively deformed.

Next, a second embodiment of the present invention will be described.

Figure 5:
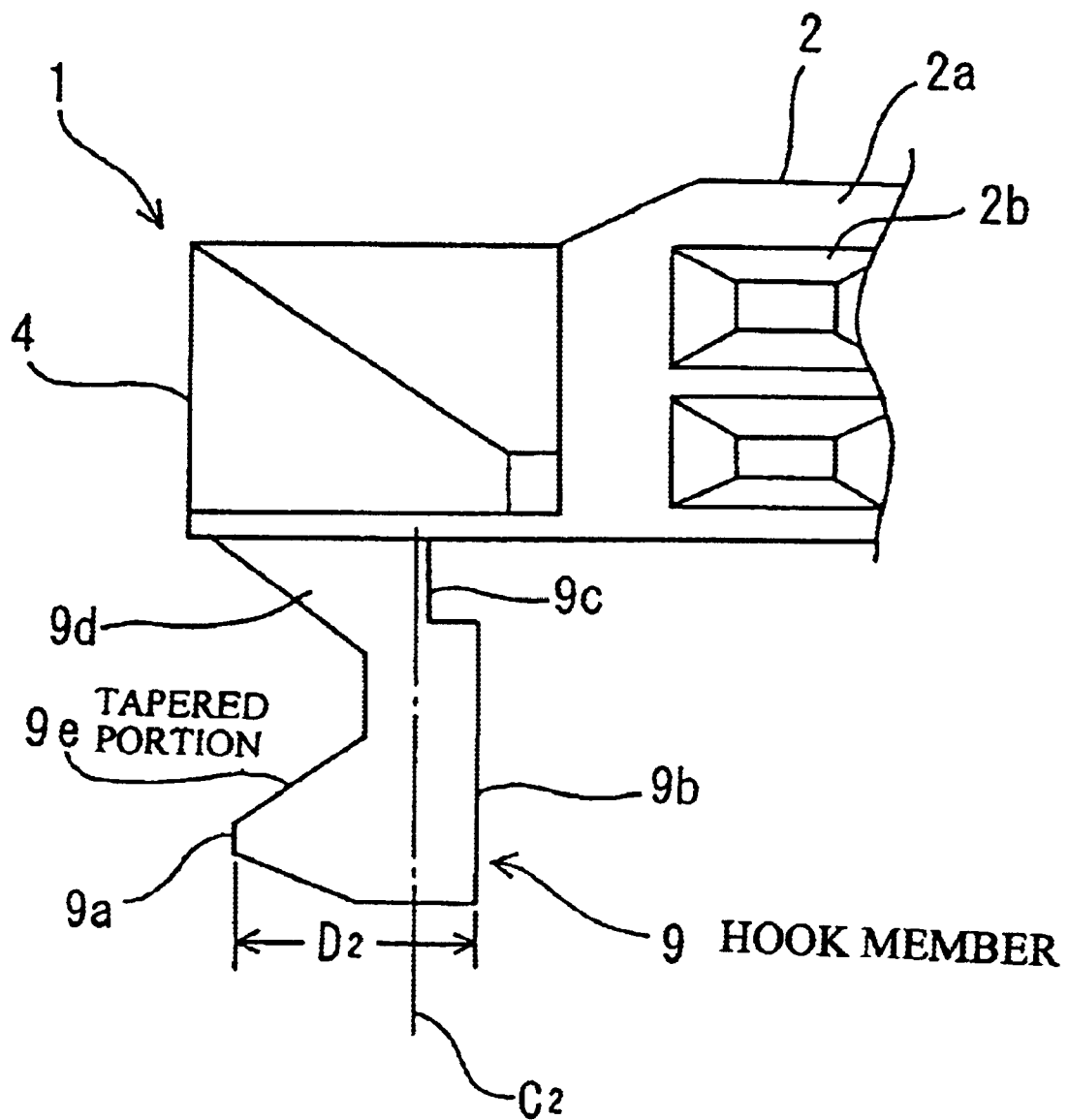
FIG. 5 is a diagram showing details of a configuration of a hook member of a connector according to a second embodiment of the invention.

FIG. 5 shows details of a configuration of a hook member of a connector according to the second embodiment. In the following description, it is assumed that part of the connector other than the hook member is identical in construction to a corresponding part of the connector 1 shown in FIGS. 1(A) and 1(B), so that identical reference numerals are used for identical components or portions and description thereof is omitted. The connector 1 according to the present embodiment has a hook member 9 formed on the underside of the arm 4 similarly to the hook member 6 of the first embodiment. The hook member 9 has a hooking portion 9a protruding outward from a shaft portion 9b integrally formed with the hooking portion 9a. The hook member 9 has a root portion asymmetrical in thickness with respect to a center line $C_2$ of the shaft portion 9b. More specifically, the root potion is formed to be thin at a portion 9c on a side remote from the hooking portion 9a, and thick at a portion 9d on the same side as the hooking portion 9a. Further, the hook member 9 is formed to have an overall width $D_2$ slightly shorter than the diameter of a through hole formed through a printed circuit board on which the connector 1 is to be mounted.

Further, the hooking portion 9a on the arm 4 side is formed with a tapered portion 9e. The tapered portion 9e is formed such that its surface faces upward outwardly of the connector 1, as viewed in FIG. 5.

Now, an action of the hooking member 9 thus constructed will be described.

Figure 6A:
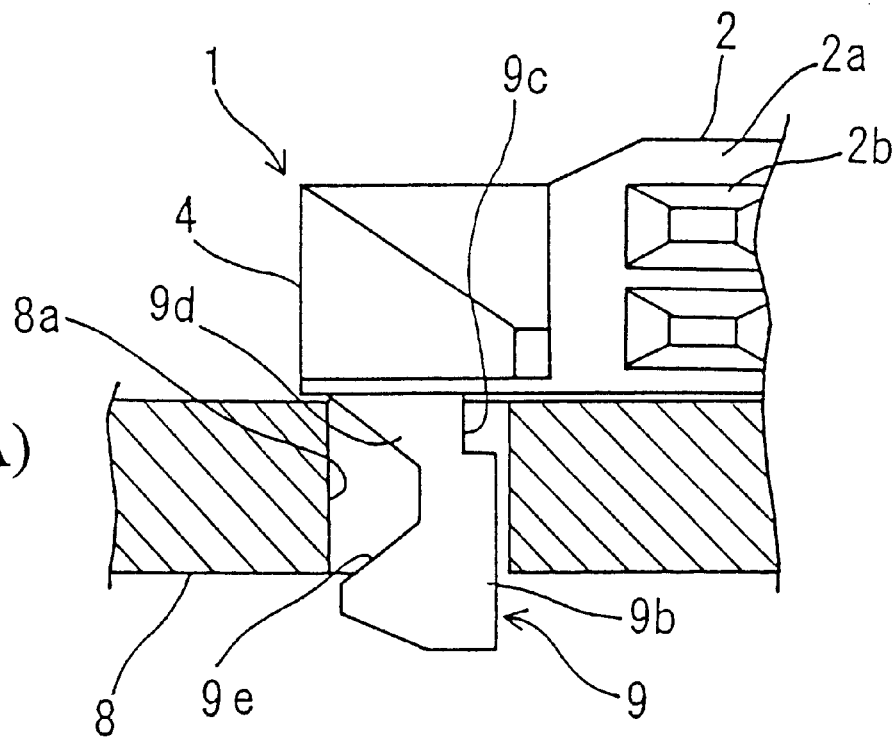
Figure 6B:
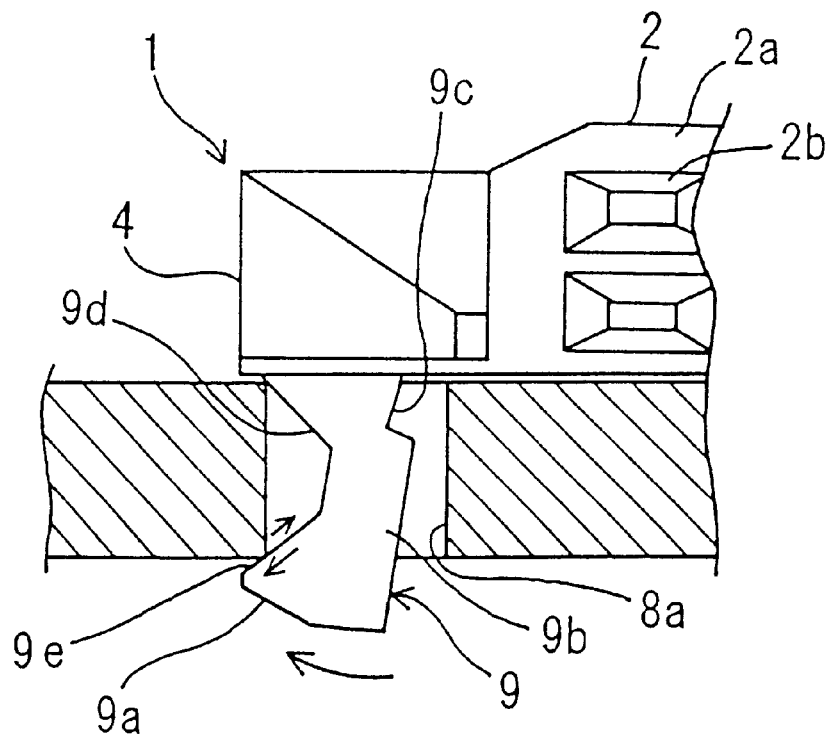

FIGS. 6(A) and 6(B) are diagrams which are useful in describing the action of the hook member 9 of the connector 1 according to the second embodiment. FIG. 6(A) shows the connector 1 and the printed circuit board 8 in a state in which the hook member 9 has been inserted through the printed circuit board, while FIG. 9(B) shows the same in a state in which the reflow process has been carried out. In surface mounting the connector 9 on the printed circuit board 8, as shown in FIG. 6(A), the hook member 9 is inserted through a through hole 8a formed in advance through the printed circuit board 8. Since the width of the hook member 9 is formed to be slightly shorter than the diameter of the through hole 8a, the hook member 9 can be easily inserted through the through hole 8a without requiring a special mounting apparatus or manual operations. Further, when the hook member 9 has been inserted, it projects from the underside of the printed circuit board 8 to an appropriate extent.

Similarly to the hook member 9, a hook member, not shown, formed on the arm 5 is also inserted through a through hole, not shown, of the printed circuit board. Thus, the connector 1 is placed on the printed circuit board 8. Since the hook member 9 and the like are inserted through the respective through holes, the connector 1 is accurately positioned, which causes the lead pins 3 to be easily and accurately positioned.

When the printed circuit board 8 is placed in a reflow furnace, and heated to a temperature of approximately 200° C., the soldering paste is melted to thereby effect soldering of terminals of the chips including the lead pins 3.

When the printed circuit board 8 is removed from the reflow furnace for cooling, the hook member 9 is deformed as shown in FIG. 6(B) such that it is bent toward the hooking portion 6a side for the same reason set forth in FIG. 1(A) and FIG. (B). This forces the tapered portion 9e of the hooking portion 9a into abutment with an edge of the through hole 8a of the printed circuit board 8 and converts the bending force of the hook member 9 into downwardly sliding motion thereof with respect to the edge. As a result the hook member 9 acts to swage itself on the printed circuit board 8 whereby the connector 1 is more firmly fixed to the printed circuit board 8.

It should be noted that when the hook member 9 is employed, provision of the through hole 8b and the land 8c shown in FIGS. 4(A) and 4(C) makes it possible to more effectively fix the connector 1 to the printed circuit board 8.

Next, a third embodiment of the present invention will be described.

Figure 7A:
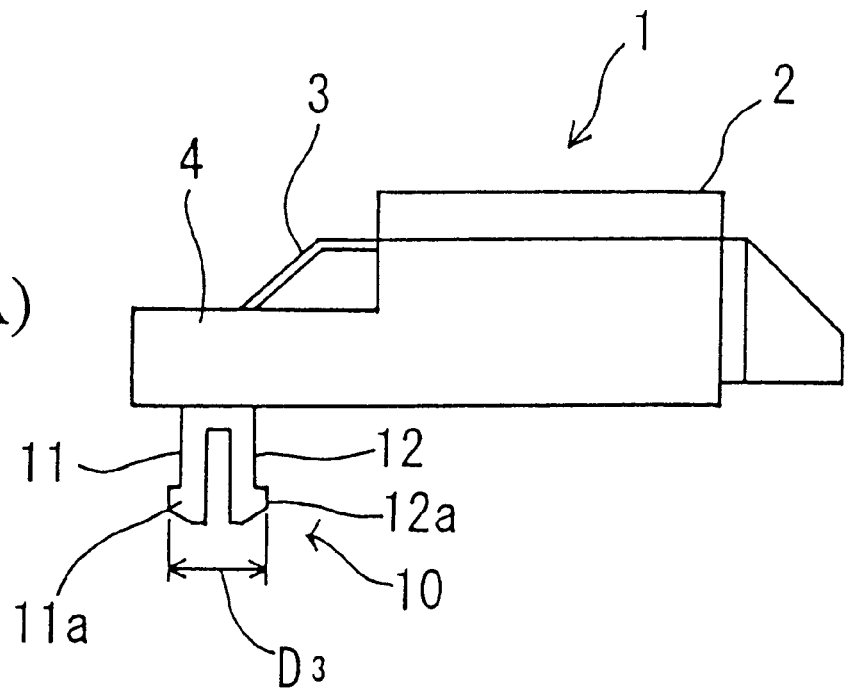
Figure 7B:
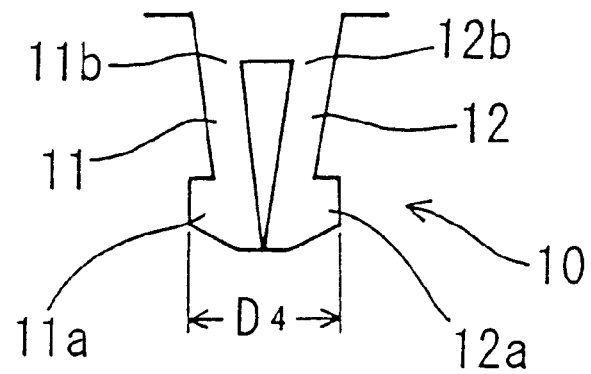

FIGS. 7(A) and 7(B) show details of a configuration of a hook member of a connector according to the third embodiment. FIG. 7(A) is side view of the connector having the hook member of the present embodiment, and FIG. 7(B) shows a deformed shape which the hook member takes during a mounting operation of the connector 1. In the following description, it is assumed that part of the connector other than the hook member is identical in construction to a corresponding part of the connector 1 shown in FIGS. 1(A) and 1(B), so that identical reference numerals are used for identical components or portions and description thereof is omitted. The connector 1 according to the present embodiment has a hook member 10 formed on the underside of the arm 4, and similarly, a hook member, not shown, which is identical in construction, is formed on the other arm 5.

Referring first to FIG. 7(A), the hook member 10 is of a forked type which is generally employed and the whole hook member 10 is formed of a synthetic resin. When the connector 1 is molded, two pins 11, 12 are substantially parallel with each other and a side-to-side width $D_3$ across end portions of the hooking portions 11a, 12a is slightly larger than the diameter of a through hole formed through the printed circuit board, into which the hook member 10 is inserted.

when the connector 1 having the hook member 10 formed as above is mounted on the printed circuit board, the hook member 10 is heated up to a temperature of 50° C. to 60° C. so as to be deformed as shown in FIG. 7(B), and then cooled to make the side-to-side width $D_4$ of the hooking portions 11a, 12a sufficiently smaller than the diameter of the through hole of the printed circuit board. This enables the hook member 10 to be easily inserted without requiring a special mounting apparatus and manual operations. When this heat treatment is effected, a stress remains at each of the root portions 11b, 12b of the pins 11 and 12.

Then, when the reflow process is carried out on the printed circuit board similarly to the first and second embodiments, the pins softened by heat at a temperature of 200° C. generated for the reflow process are opened by the stress remaining at the root portions 11b, 12b to recover the state shown in FIG. 7(A). This causes the hooking potions 11a, 12a to be fixedly fitted through the through hole of the printed circuit board whereby the connector 1 is firmly mounted on the printed circuit board.

Now, a fourth embodiment of the invention will be described.

Figure 8A:
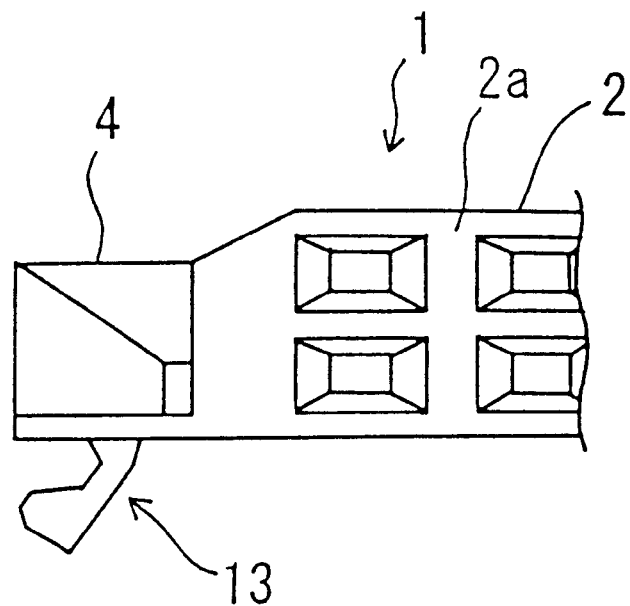
Figure 8B:
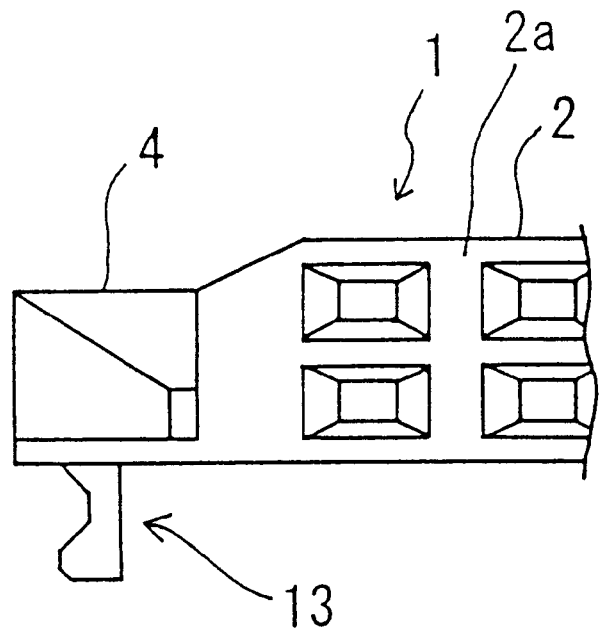

FIGS. 8(A) and 8(B) are diagrams which are useful in describing a method of mounting a connector, according to the fourth embodiment. FIG. 8(A) is a front view schematically showing the construction of a connector having a hook member in its original state, while FIG. 8(B) is a front view schematically showing the construction of the connector having the hook member in its state during the mounting operation. It should be noted that the connector 1 of the present embodiment is substantially identical in construction to that of the first embodiment except for the structure of the hook member 13, so that identical reference numerals are used for identical components and detailed description thereof is omitted. Further, FIGS. 8(A) and 8(B) show only a left-side portion of the connector 1, but a right-side portion of the same is substantially identical in construction to the right-side portion, and hence description thereof is omitted.

The hook member 13 is formed of a shape memory alloy, e.g. a Ni—Ti2-based alloy. The Ni—Ti2-based alloy has a shape-recovering temperature in the range of approximately 30° C. to 120° C. The basic shape of the hook member 13 is set to a shape substantially identical to that of the hook member 9 of the second embodiment. As shown in FIG. 8(A), the hook member 13 is formed in advance such that it has a memory of a bent shape for engagement with a through hole formed through a printed circuit board. However, so long as a normal temperature is maintained, it is in a substantially linearly-extending state as shown in FIG. 8(B).

In mounting the connector 1 on the printed circuit board, the hook member 13 having the shape as shown in the FIG.

8(B) is inserted into the through hole of the printed circuit board. When the reflow process is carried out on the printed circuit board, an elevated temperature (200° C.) for the reflow process causes the hook member 13 to recover its shape as shown in FIG. 8(A). This firmly fixes the connector 1 to the printed circuit board. Further, since the connector 1 is fixed when it is in the reflow furnace, this enhances soldered states of the lead pins 3.

Although in the present embodiment, the hook member 13 has the basic shape identical to the shape of the hook member 9, this is not limitative, but it may be set to a shape similar to that of the hook member 6 of the first embodiment.

Further, although the Ni-Ti2-based alloy is used as the shape memory alloy, this is not limitative, but any other suitable shape memory alloy may be employed instead.

Next, a fifth embodiment of the invention will be described.

Figure 9A:
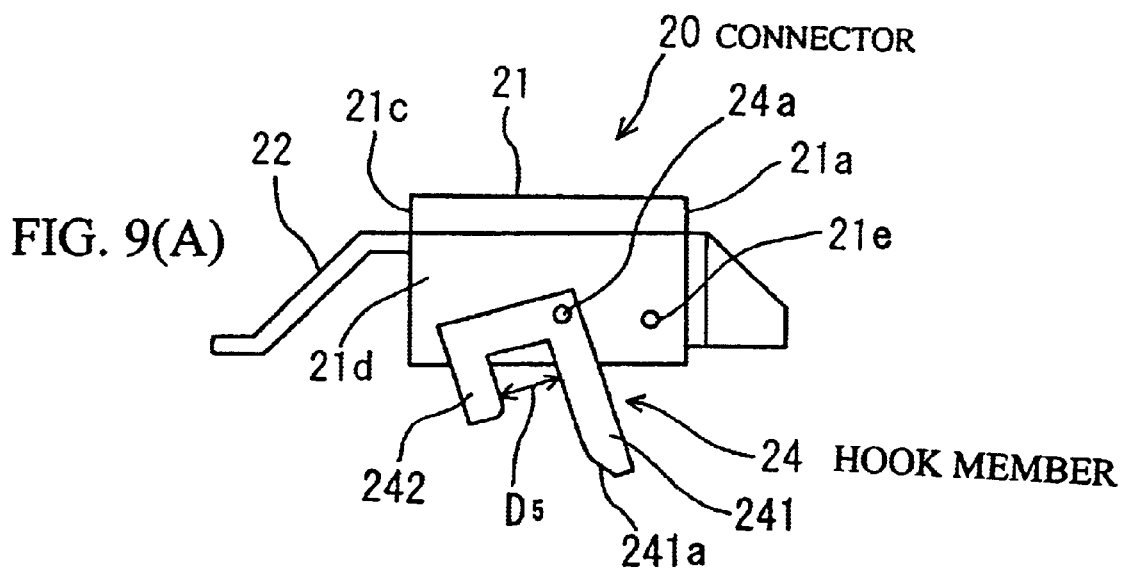
Figure 9B:
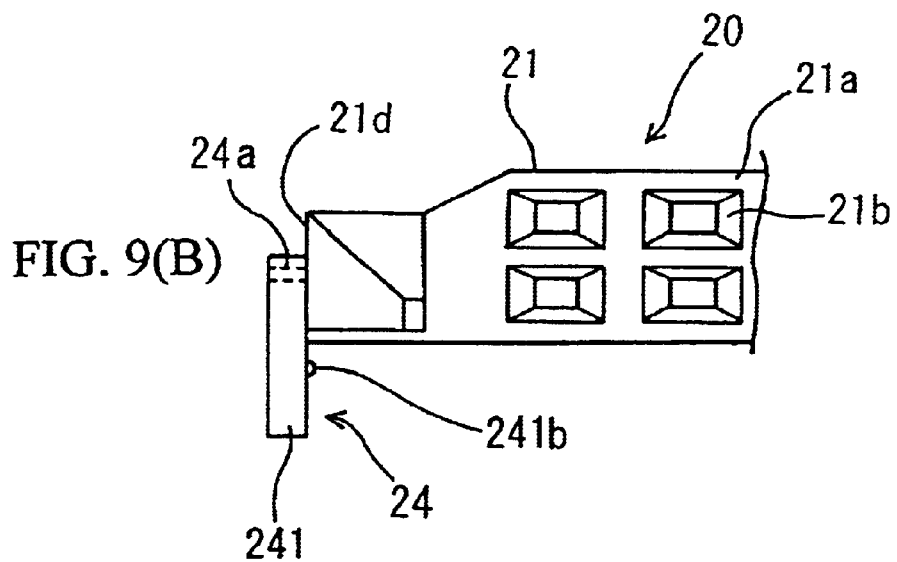

FIGS. 9(A) and 9(B) show the construction of a connector according to the fifth embodiment. FIG. 9(A) is a side view of the connector, while FIG. 9(B) is a front view of the same as viewed from a connecting surface side. The connector 20 of the present embodiment has a body 21 having a connecting surface 21a thereof formed with insertion holes 21b into which pins of a male connector to be connected are inserted. On the other hand, a large number of lead pins 22 extend from a surface 21c on an opposite side of the connector 20 to the connecting surface 21a side. The body 21 has a rotary-type hook member 24 pivotally connected to a side surface 21d of the body 21 by a pivot 24a for pivotal motion about the pivot 24a. A hook member which is substantially identical in shape to the hook member 24 is attached to an opposite side surface to the side surface 21d, and description thereof is omitted.

The hook member 24 is formed such that a distance $D_5$ between opposed inner surfaces of a long pin 241 and a short pin 242 is substantially identical to a thickness of the printed circuit board on which the connector 20 is to be mounted. The long pin 241 has a tapered portion 241a provided at an end thereof. Further, the pin 241 has a convex portion 241b formed on an inner side surface facing toward the body 21. On the other hand, the body 21 has a concave portion 21e formed on the side surface 21d thereof for having the convex portion 241b fitted therein when the pin 241 is brought to a substantially level position.

Next, a method of mounting the connector 20 having the hook member 24 constructed as above on a printed circuit board will be described.

Figure 10A:
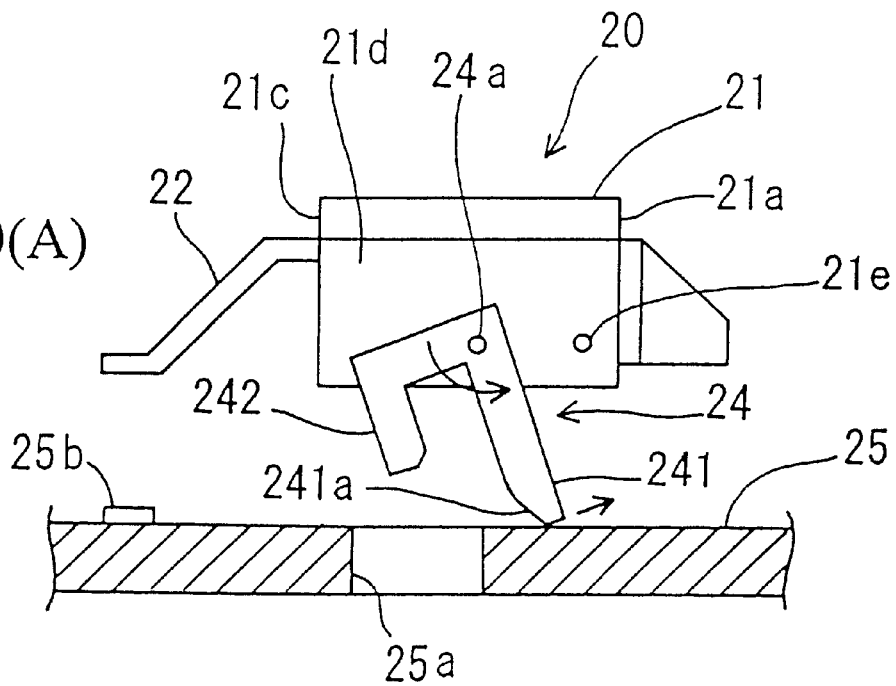
Figure 10B:
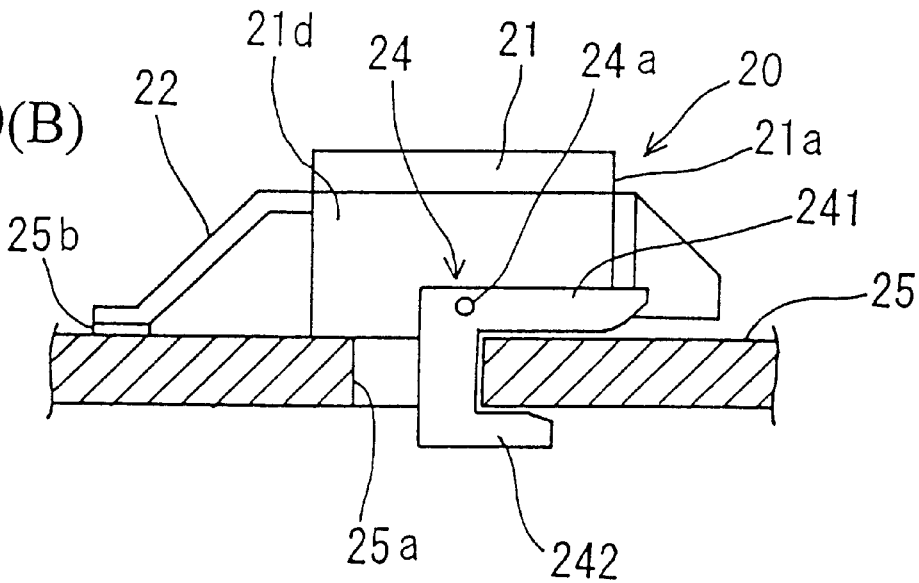

FIGS. 10(A) and 10(B) are diagrams which are useful in specifically describing the method of mounting the connector 20 according to the fifth embodiment. FIG. 10(A) shows the connector 20 and the printed circuit board 25 in a state in which the connector 20 is about to be mounted on the printed circuit board 25, while FIG. 10(B) shows the same in which the connector 20 has been mounted on the printed circuit board 25. When the connector 20 is lowered from a position above a through hole 25a of the printed circuit board 25, first, the tapered portion 241a of the pin 241 is brought into contact with the surface of the printed circuit board 25. When the connector 20 continues to be lowered, the tapered portion 241a receives an urging force from the surface of the printed circuit board 25, which causes pivotal motion or rotation of the whole hook member 24 in a counterclockwise direction as viewed in FIG. 10(A).

Then, when the bottom of the body 21 is brought into contact with the surface of the printed circuit board 25, the short pin 242 has been rotated into the through hole 25a and catches the printed circuit board 25 between itself and the long pin 241. At the same time, the convex portion 241b of the pin 241 is fitted in the concave portion 21e of the side surface 21d of the body 21. This fixes the connector 20 to the printed circuit board 25. Therefore, the connector 20 can be easily mounted on the printed circuit board with a small force.

Next, a sixth embodiment of the invention will be described.

Figure 11A:
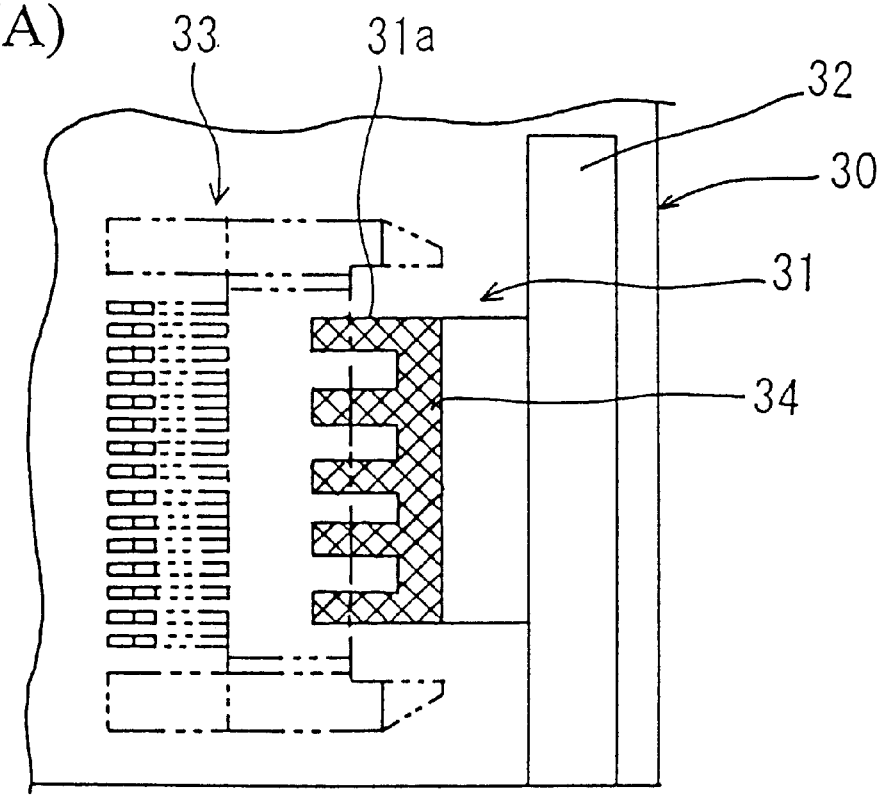
Figure 11B:
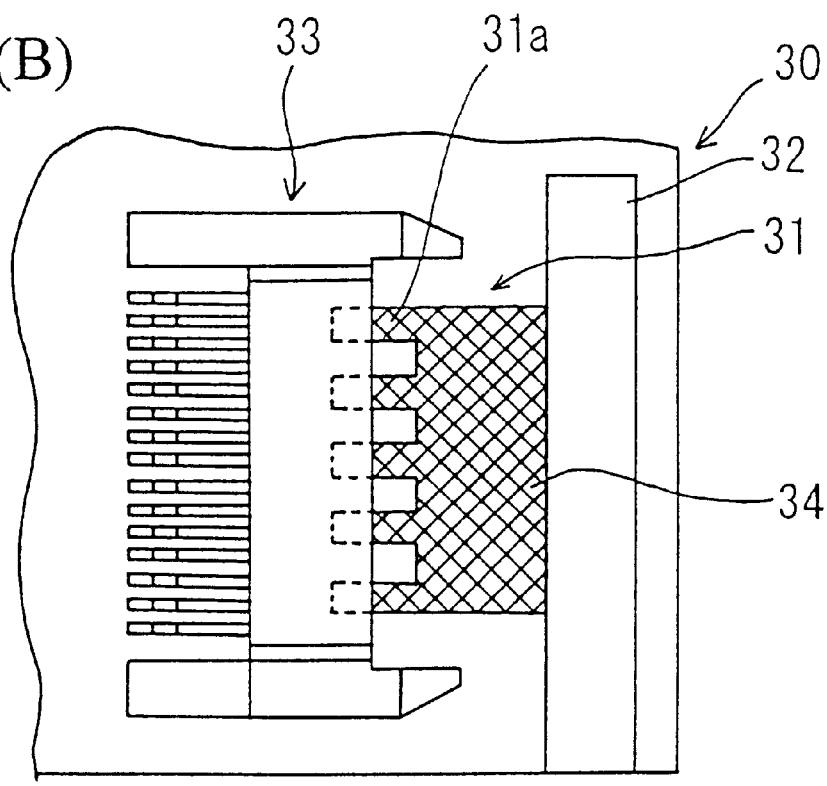

FIGS. 11(A) and 11(B) are diagrams which are useful in describing a method of mounting a connector according to the sixth embodiment. FIG. 11(A) is a front view showing the construction of a portion of a printed circuit board on which the connector is to be mounted, while FIG. 11(B) is a view showing the connector mounted on the printed circuit board. The printed circuit board 30 employed in the present embodiment has a surface formed with a dummy pattern 31 having a plurality of patterns 31a in the form of comb teeth. The dummy pattern 31 is formed at a location where the bottom of the connector 33 and the patterns 31a partially overlap each other. Further, on an opposite side of the dummy pattern 31 to the pattern 31a side, there is a pattern 32 formed by resist printing.

Soldering paste 34 is applied to an area of the comb teeth-shaped patterns 31a of the dummy pattern 31 constructed as above. Then, the connector 33 is mounted on the printed circuit board 30 such that the connector 33 partially overlap the dummy patterns 31, as shown in FIG. 11(B), and the whole printed circuit board 30 is placed in a reflow furnace. During this process, the connector 33 is prevented from being displaced or lifted by the adhesion of the soldering paste 34. This enables the connector 33 to be easily mounted on the printed circuit board without providing a special mounting apparatus.

Within the reflow furnace, the soldering paste 34 is the melted and moves to an area outside the pattern 31a on the dummy pattern 31. A suction force generated at this time attracts the connector 33 to the printed circuit board 30, whereby the connector 33 is firmly fixed to the printed circuit board 30 while displacement or undesired lifting of the contact from the surface of the printed circuit board 30 is prevented. This enables the connector 33 to be easily mounted on the printed circuit board without providing a special mounting apparatus.

Next, a seventh embodiment of the invention will be described.

Figure 12:
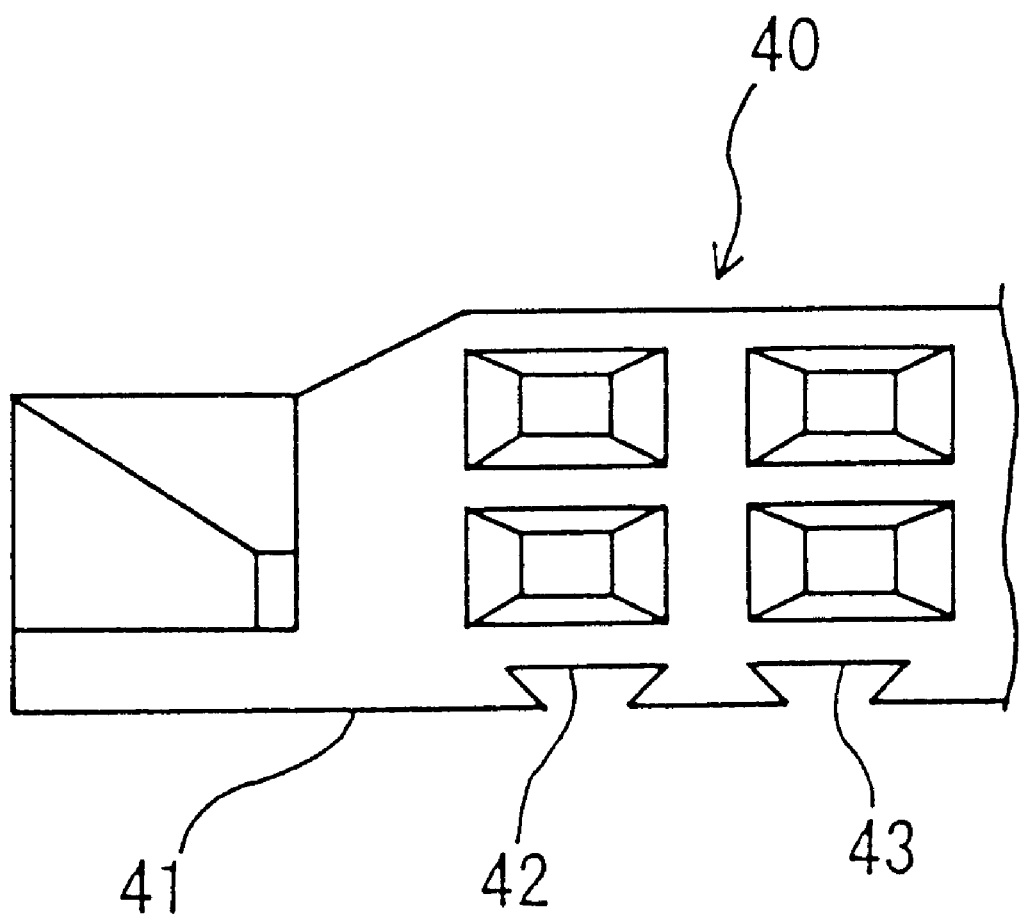
FIG. 12 is a diagram showing the construction of a connector according to a seventh embodiment of the invention.

FIG. 12 shows the construction of an essential portion of the connector according to the seventh embodiment. The connector 40 according to the present embodiment has a bottom 41 formed with a plurality of dovetail grooves 42, 43. The number, length and width of dovetail grooves 42, 43 can be changed as desired.

Figure 13A:
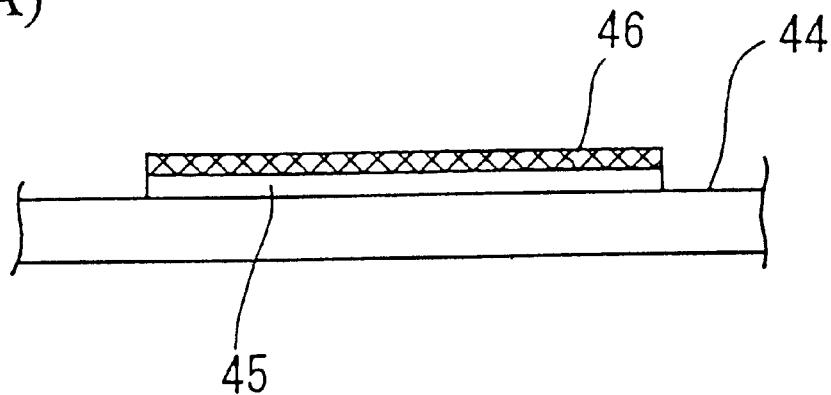
Figure 13B:
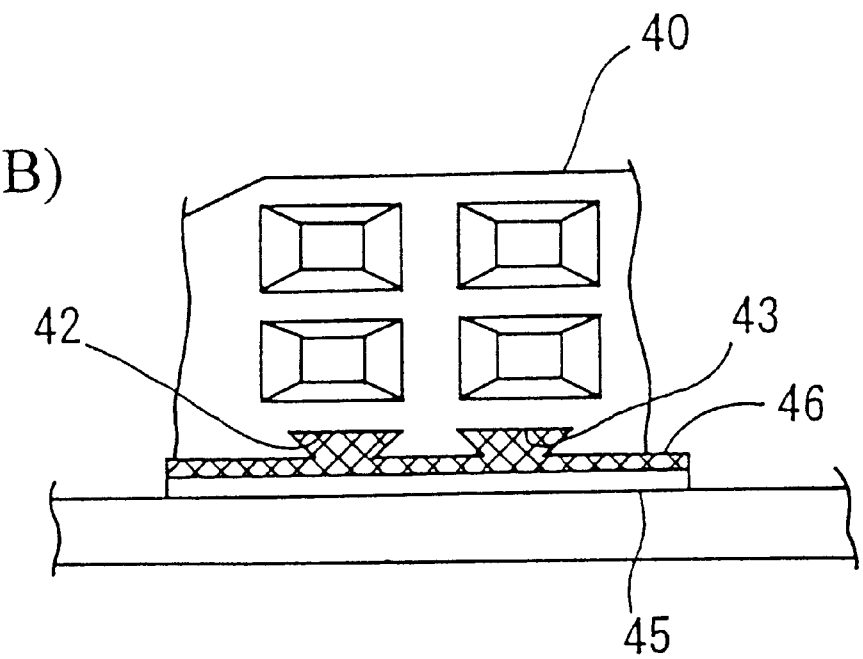

FIGS. 13(A) and 13(B) are diagrams which are useful in describing a method of mounting the connector of the present embodiment on a printed circuit board. FIG. 13(A) shows the construction of a portion of the printed circuit board, while FIG. 13(B) shows a portion of the connector 40 having been mounted on the printed circuit board 44. The printed circuit board 44 on which the connector 40 is to be mounted is formed, as shown in FIG. 13(A), with a dummy pattern 45 provided at a location at which the connector 40 is to be placed. Soldering paste 46 is applied to the top surface of the dummy pattern 45.

The connector 40 is placed on the printed circuit board 44 constructed as above, and the reflow process is carried out.

At this time, as shown in FIG. 13(B), the soldering paste 46 is melted by heat generated for the reflow process and drawn into the dovetail grooves 42, 43. This suction force firmly fixes the connector 40 to the printed circuit board 44, thereby preventing the connector from being displaced or lifted. This enables the connector 40 to be easily mounted on the printed circuit board without providing a special mounting apparatus for the connector 40.

Next, an eighth embodiment of the invention will be described.

Figure 14A:
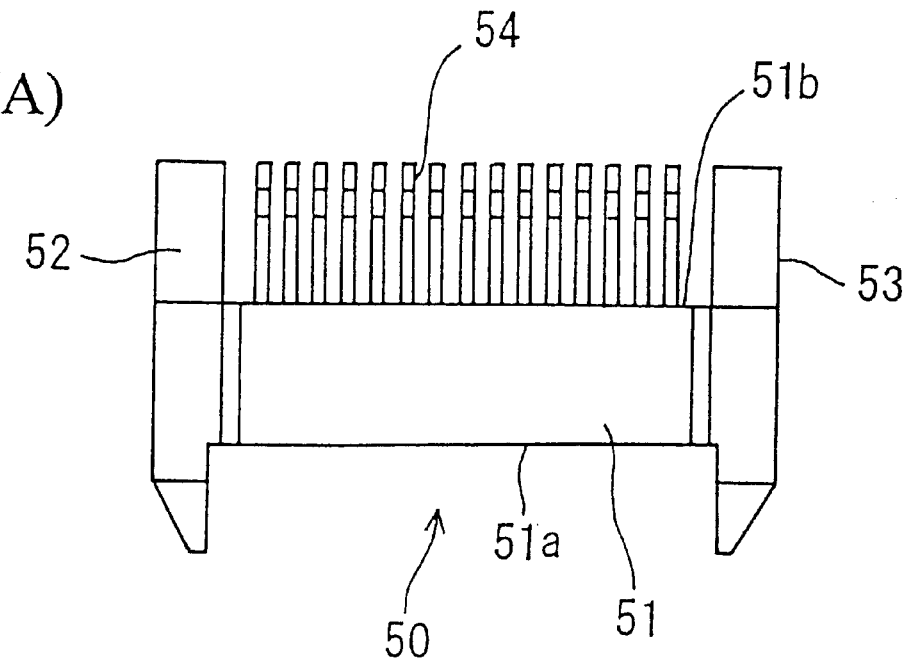
Figure 14B:
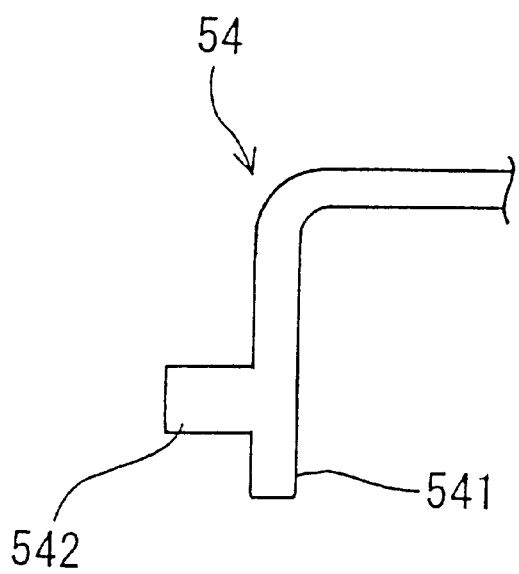

FIGS. 14(A) and 14(B) are diagrams showing the construction of the connector according to the eighth embodiment. FIG. 14(A) is a plan view of the connector, while FIG. 14(B) shows details of a configuration of a lead pin. A large number of lead pins 54 extend from a surface 51b of a body 51 of the connector 50 on a side opposite to a connecting surface 51a side of the body 51. Further, the body 51 has arms 52, 53 integrally formed on opposite lateral sides thereof for protecting the lead pins 54.

As shown in FIG. 14(B), each lead pin 54 is formed with a soldering portion 542 at a location slightly above an end 541 thereof.

Figure 15A:
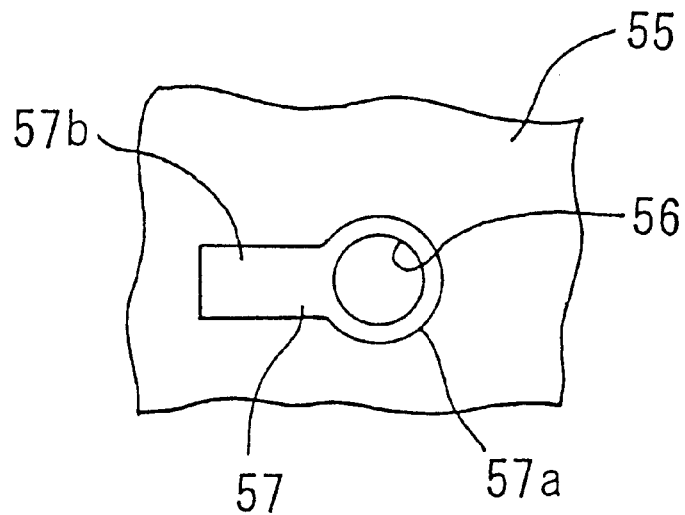
Figure 15B:
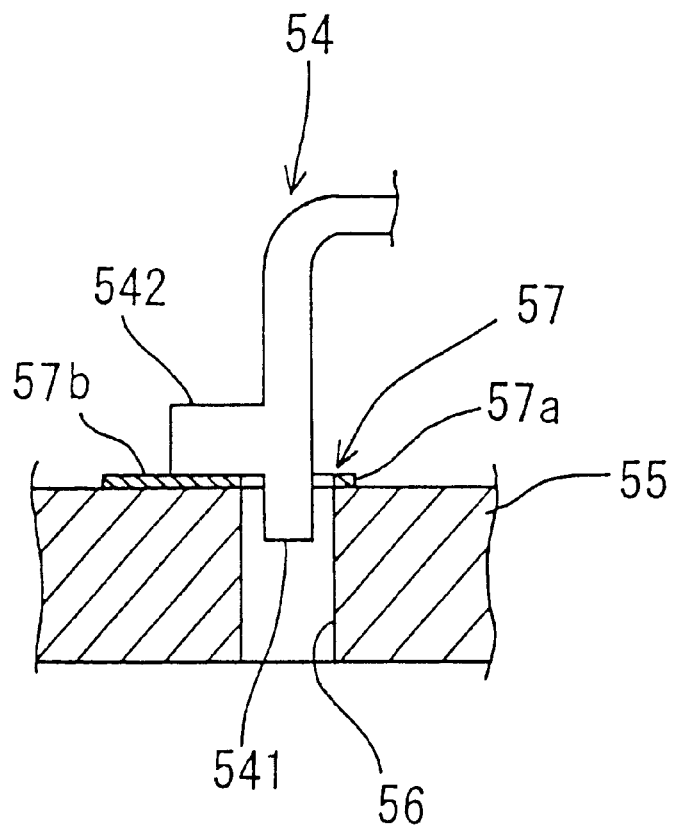

FIGS. 15(A) and 15(B) are diagrams which are useful in describing a method of mounting each lead pin 54 of the connector 50 according to the eighth embodiment. FIG. 15(A) is a plan view showing the construction of a portion of the printed circuit board at which the lead pin 54 is to be mounted, while FIG. 15(B) is a cross-sectional view showing the lead pin 54 having been actually mounted in the above-mentioned portion of the printed circuit board 55. The printed circuit board 55 has through holes 56 formed through portions for mounting respective lead pins 54, and lands 57 formed on the surface of the portion such that they surround corresponding ones of the through holes 56. Each land 57 is comprised of an annular portion 57a for surrounding the periphery of the opening of a corresponding one of the through holes 56, and a strip portion 57b.

Soldering paste is applied to the land 57, and further, the lead pin 54 is fitted, as shown in FIG. 15(B). In doing this, an end 541 of the lead pin 54 is inserted into the through hole 56, and the soldering portion 542 is placed on the strip portion 57b of the land 57. Then, when the reflow process is carried out, the lead pin 54 is soldered to the printed circuit board 55.

As described above, according to the present embodiment, the end 541 of the lead pin 54 is inserted into the through hole 56 and the soldering portion 542 is soldered to the surface of the land 57. Therefore, compared with the conventional process of merely soldering the lead pin 54 to the surface of the land, the lead pin 54 can be more firmly mounted on the printed circuit board 55. This prevents the soldered portion of the lead pin 54 from being broken even if a male connector is repeatedly inserted and removed.

Further, since the end 541 is inserted into the through hole 56, the positioning of the lead pin 54 can be easily carried out. Therefore, it is possible to easily mount the connector 50 on the printed circuit board 55 by manual operations. Further, the displacement of the lead pins at a stage prior to the reflow process can be prevented.

Further, the lead pins can be soldered such that they extend into the respective through holes, the present method can be applied not only to the surface mount but also to a manufacturing process based on the inner mount method.

Figure 16A:
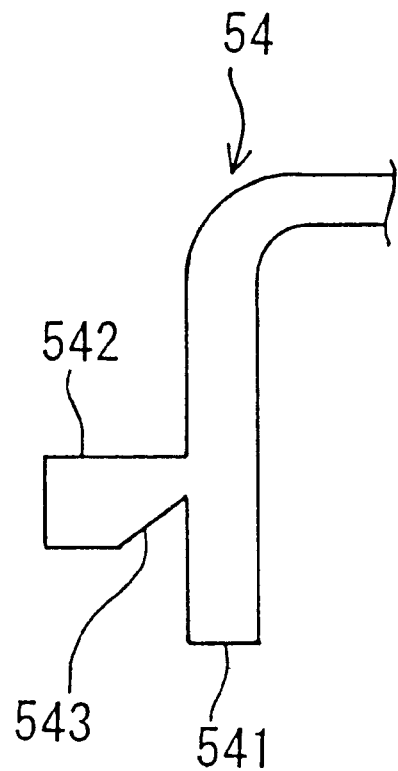
Figure 16B:
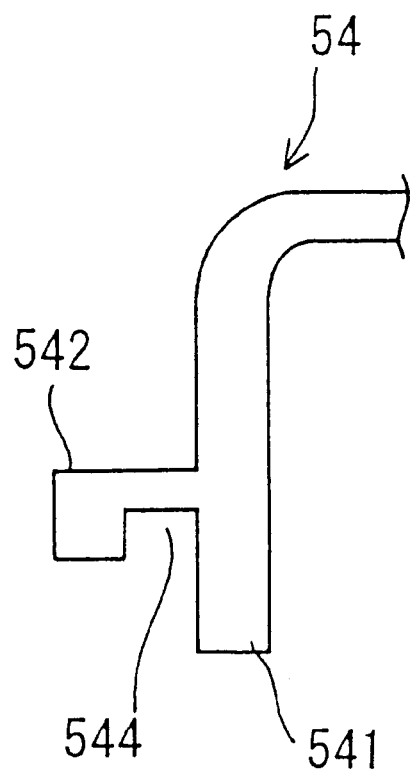

FIGS. 16(A) and 16(B) show variations of the lead pin 54 of the connector 50 according to the eighth embodiment of the invention. FIG. 16(A) shows a first variation, and FIG. 16(B) shows a second variation. As shown in FIG. 16(A), the lead pin 54 is formed with a triangular cutout 543 at a root portion of the soldering portion 542 of the lead pin 54. Alternatively, a rectangular cutout 54 may be formed as shown in FIG. 16(B).

Figure 17A:
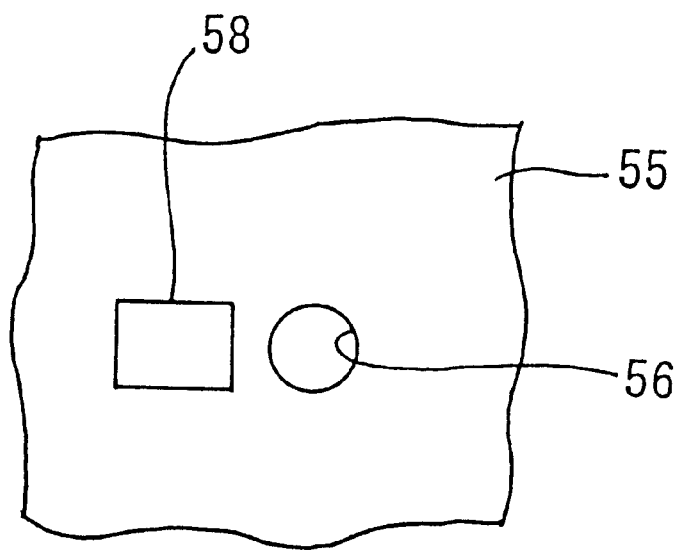
Figure 17B:
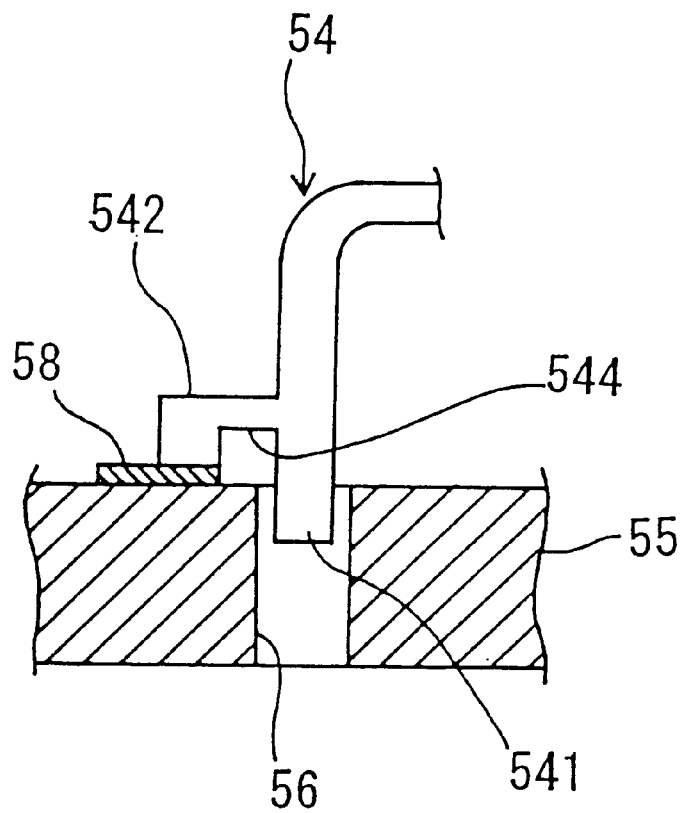

FIGS. 17(A) and 17(B) are diagrams which are useful in describing a method of soldering the lead pins 54 shown in FIGS. 16(A) and 16(B). FIG. 17(A) is a plan view showing the construction of a land of a printed circuit board to which the lead pin 54 is to be soldered, while FIG. 17(B) is a cross-sectional view showing the lead pin 54 actually soldered to the land on the printed circuit board. In the following, a method will be described in which the lead pin 54 formed with the rectangular cutout as shown in FIG. 16(B) is employed. First, the printed circuit board 55 to which the lead pin 54 is to be soldered is formed with the through hole 56 and the land 58 slightly away from the through hole 56. The end 541 of the lead pin 54 is inserted into the through hole 56. The soldering portion 542 of the lead pin 54 is placed on the land 58 having the soldering paste applied thereto.

In this state, the printed circuit board 55 is placed in a reflow furnace for the reflow process. During the reflow process, even if the soldering paste is flowed over the land 58, it is received into the recess 544 formed in the lead pin 54. This prevents the solder from flowing into the through hole 56, which preserves the quality of a junction of the lead pin 54 and the land 58.

Next, a ninth embodiment of the invention will be described.

Figure 18:
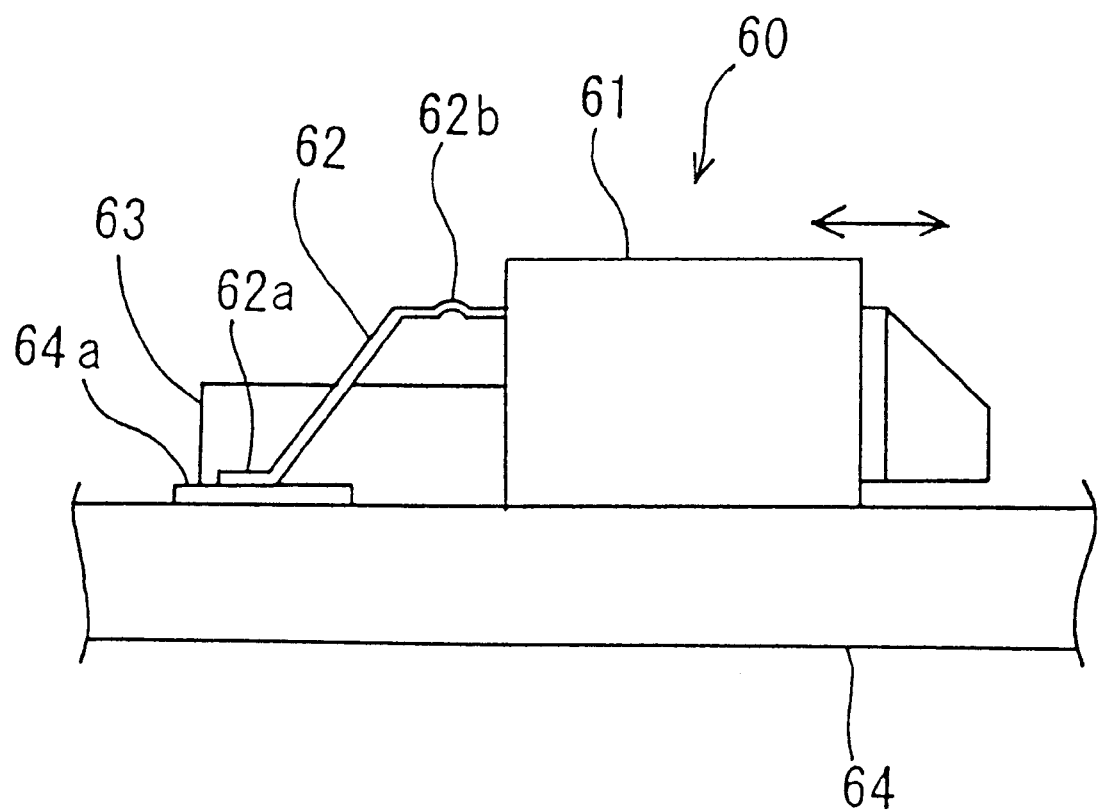
FIG. 18 is a side view showing the construction of a connector in a mounted state according to a ninth embodiment of the invention.

FIG. 18 is a side view showing the construction of a connector in a mounted state, according to the ninth embodiment. The connector 60 has a body 61 provided with a plurality of lead pins 62. Each lead pin 62 has a joining portion 62a for being soldered to a land 64a of a printed circuit board 64. An arm on this side (viewer's side) of the connector 60 is not shown in FIG. 18, but only an arm 63 on a remote side (from the viewer) of the connector 60 is shown.

The lead pin 62 is formed with a bent portion 62b at a location remote from the joining portion 62a. The provision of the bent portion 62b absorbs a force applied to the lead pin 62 (force applied leftward or rightward as viewed in FIG. 15) when a male connector is inserted and removed from the connector 60 whereby undesired load on the joining portion 62a is reduced. This improves the durability of the junction of the lead pin and the land.

It should be noted that if the joining portion 62a of the lead pin 62 is constructed similarly to that of the lead pin 54 of the eighth embodiment, the lead pin 62 can be more firmly joined to the land 64a.

Next, a tenth embodiment of the invention will be described.

Figure 19A:
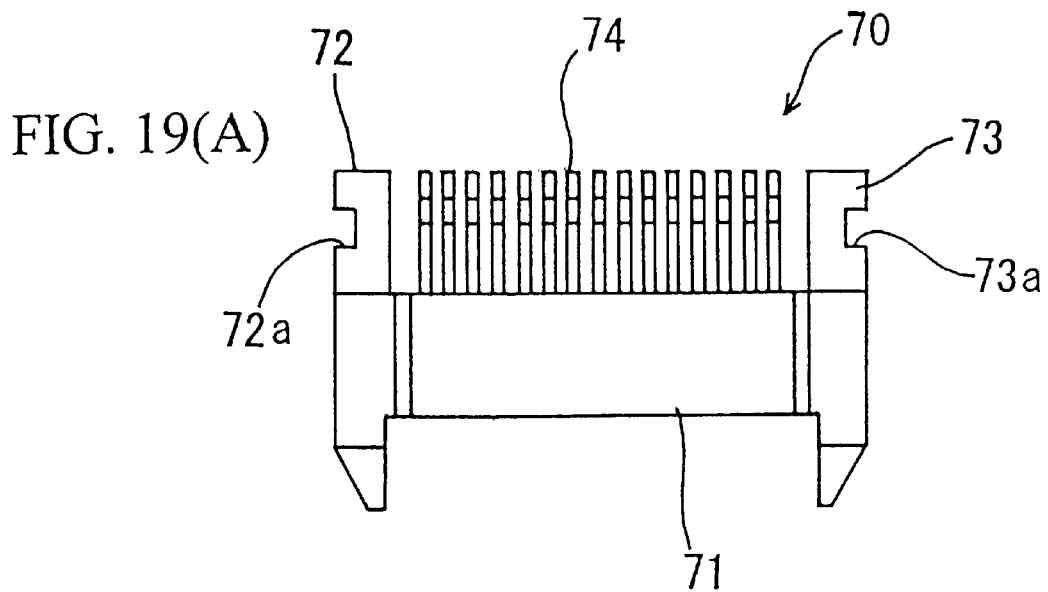
Figure 19B:
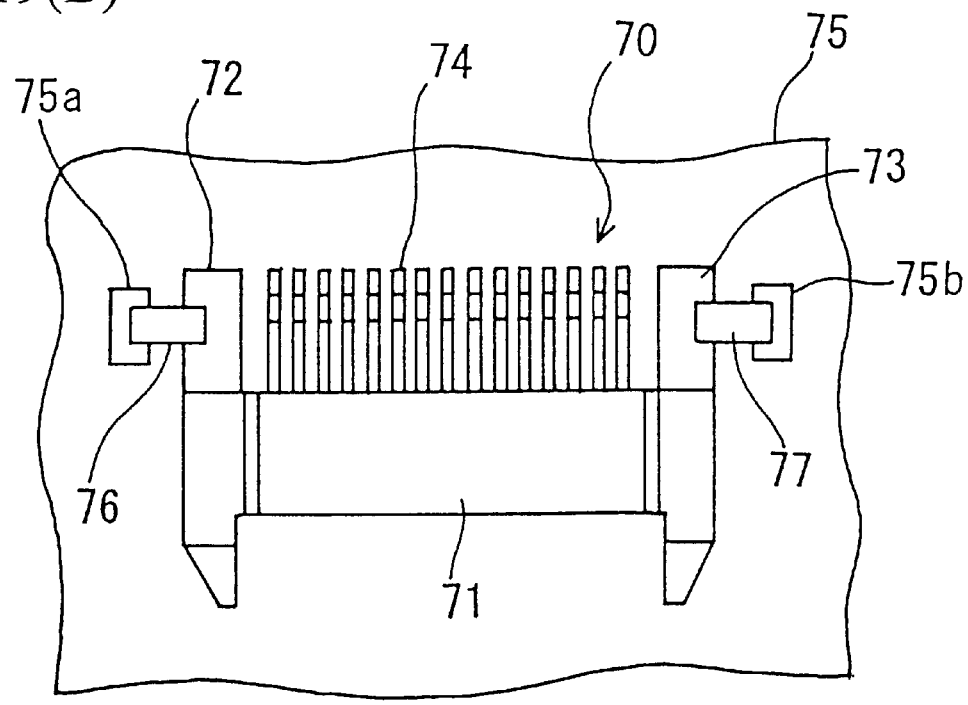

FIGS. 19(A) and 19(B) show the construction of a connector according the tenth embodiment. FIG. 19(A) is a plan view of the connector, while FIG. 19(B) shows the connector having been mounted on a printed circuit board. As shown in FIG. 19(A), lead pins 74 extend from a body 71 of the connector 70 of the present embodiment. The body 71 is formed with arms 72, 73 for protecting the lead pins 74. The arms 72 and 73 are formed with recesses 72a, 73a in which respective chips can be fitted.

In the surface of the printed circuit board 75 on which the connector 70 constructed above is to be mounted, there are formed, as shown in FIG. 19(B), lands 75a, 75b, between which the connector 70 is placed. Then, one end of a chip 76 which plays no role in the circuit is fitted in the recess 72a of the arm 72 and the other end of the chip 76 is soldered to the land 75a. Similarly, one end of a chip 77 is fitted in the recess 73a of the arm 73, and the other end of the same is soldered to the land 75b.

This enables the connector 70 to be firmly mounted on the printed circuit board 75, thereby enhancing the firmness of junction of each lead pin 74. Further, when a force abnormally strong as causes undesired effects on the lead pins 74 is applied to the connector 70, the chips 76, 77 are detached, and hence the abnormal state of the connector 70 can be easily confirmed.

Next, an eleventh embodiment of the invention will be described.

Figure 20A:
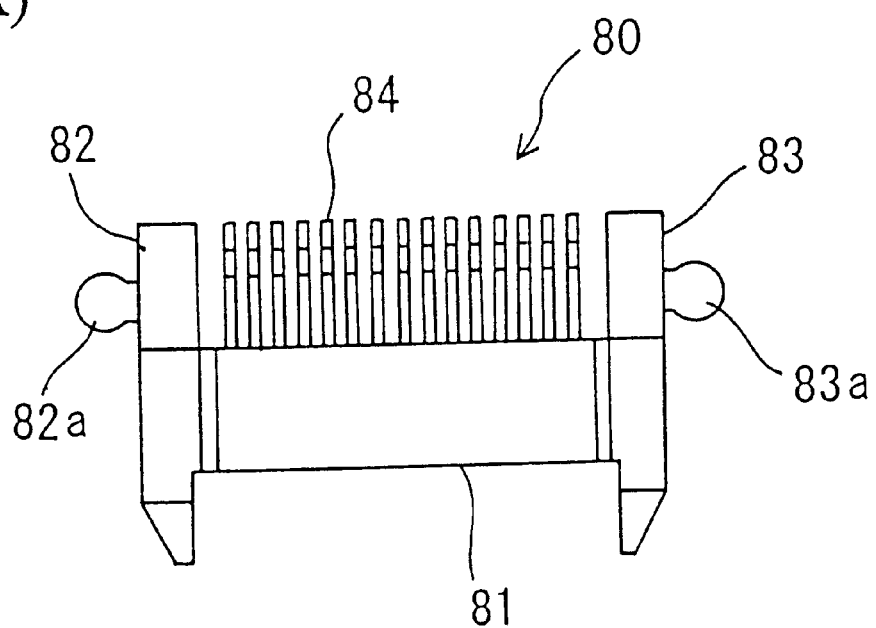
FIG. 20(A) is a plan view showing the construction of a connector according to an eleventh embodiment of the invention.
Figure 20B:
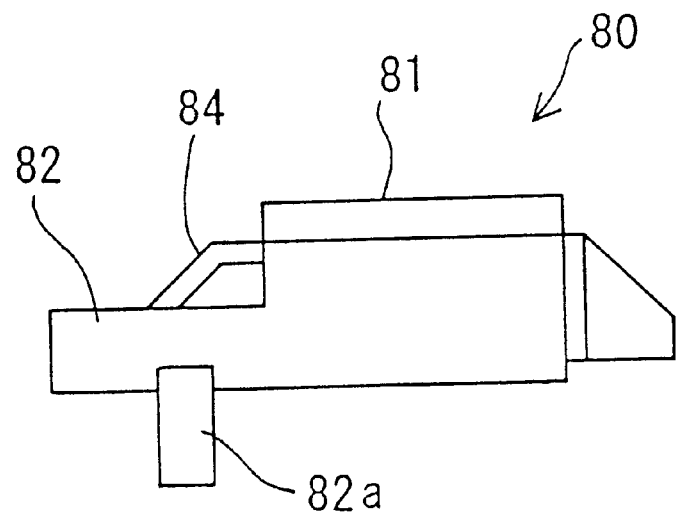
FIG. 20(B) is a side view showing the construction of the connector according to the eleventh embodiment.

FIGS. 20(A) and 20(B) are diagrams showing the construction of a connector according to the eleventh embodiment. FIG. 20(A) is a plan view of the connector, while FIG. 20(B) is a side view of the same. The connector 80 according to the present embodiment has a body 81 and lead pins 84 extending from the body 81, as shown in FIG. 20(A). The body 81 is formed with arms 82, 83 for protection of the lead pins 84. The arms 82, 83 are formed with cylindrical fitting portions 82a, 83a at respective outer lateral sides thereof. The fitting portions 82a, 83a are formed such that they extend downward to suitable points below the bottoms of the arms 82, 83, respectively.

Figure 21:
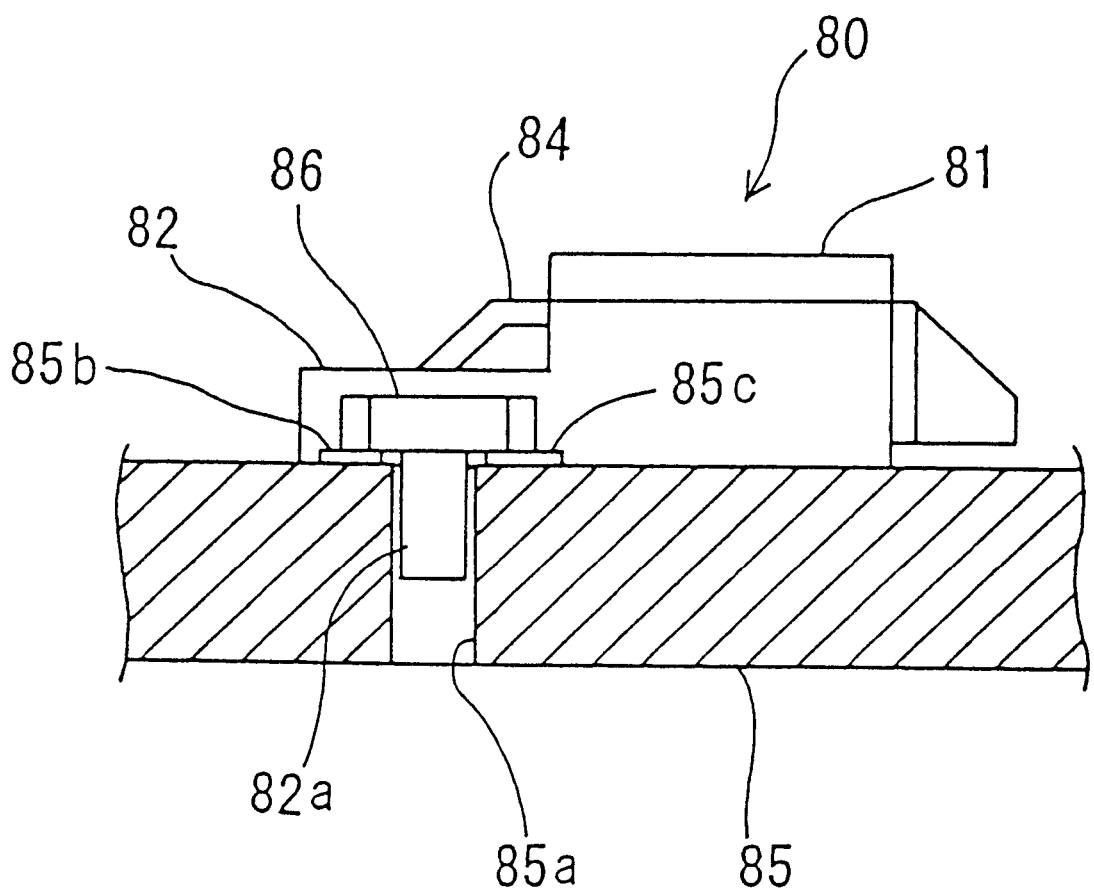
FIG. 21 is a diagram which is useful in describing a method of mounting the connector according to the eleventh embodiment on a printed circuit board.
Figure 22A:
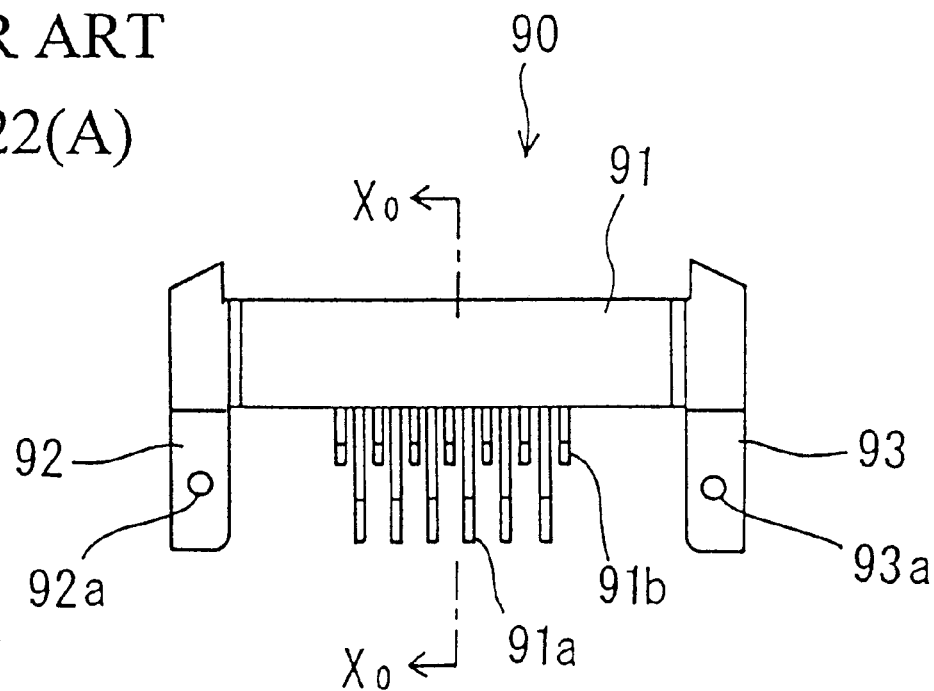
FIG. 22(A) is a plan view showing an example of the construction of a conventional connector for surface mount.
Figure 22B:
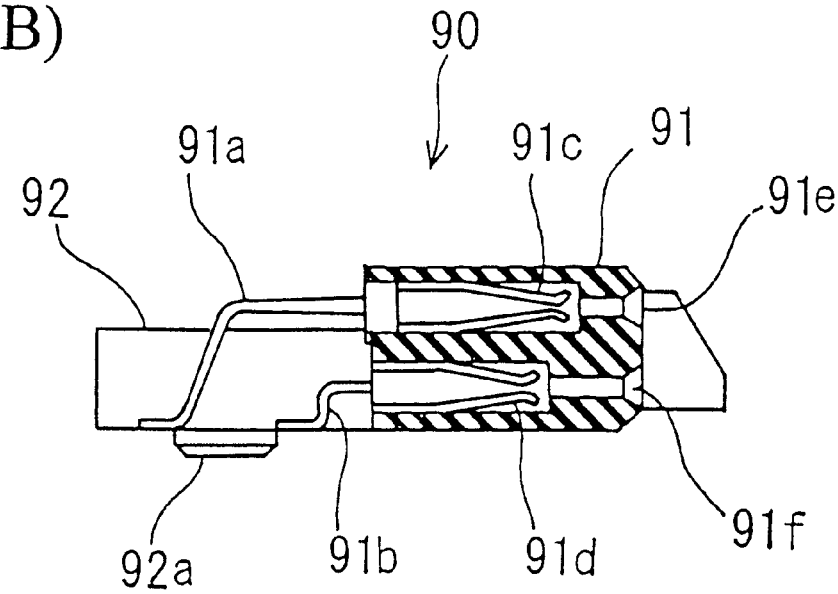
FIG. 22(B) is a cross-sectional showing the example of the construction of the conventional connector, taken on line $X_0$—$X_0$ of FIG. 22(A).

FIG. 21 is a diagram which is useful in describing a method of mounting the connector 80 according to the eleventh embodiment. A printed circuit board 85 on which the connector 80 is to be mounted is formed with a through hole 85a in a manner corresponding to the fitting portion 82a of the connector 80. Further, the printed circuit board 85 is also formed with a through hole, not shown, which corresponds to the fitting portion 83a of the arm 83. Further, two lands 85b, 85c are formed on the surface of the printed circuit board 85 with the through hole 85a located therebetween.

The fitting portion 82a of the arm 82 is inserted into the through hole 85a of the printed circuit board 85 and the fitting portion 83a into the through hole, not shown. Then, a chip 86, which plays no role in the circuit, is placed on the fitting portion 82a and opposite ends thereof are soldered to the lands 85b, 85c, respectively. The same process is carried out on the other fitting portion 83a.

This makes it possible to firmly mount the connector 80 on the printed circuit board, increase the firmness of junction of each lead pin 84, and prevent the connector 80 from being undesirably lifted. Further, when a force abnormally strong as causes undesired effects on the lead pins 84 is applied to the connector 80, the chip 86 and the like are detached, and hence the abnormal state of the connector 80 can be easily confirmed.

As described heretofore, according to the present embodiment, the hook member is deformed by heat generated for the reflow soldering to thereby bring the connector into intimate contact with the printed circuit board. Therefore, the reliability of the soldered portion can be preserved.

Further, the through hole for inserting the hook member can be provided with sufficient clearance. Therefore, the connector can be easily placed or fitted before it is soldered. This enables the connector to be automatically mounted without providing a special mounting apparatus therefor.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A connector for being surface mounted on a printed circuit board, comprising:

a flexible hook member having a thickness smaller than a size of a through hole formed in said printed circuit board, for insertion of said hook member, and at the same time, having a segment adjoined to a body of the connector wherein said segment is asymmetrical in thickness with respect to a vertical centerline of said hook member, said segment having a first portion adjacent to the vertical centerline that is thicker than a second portion adjacent to the vertical centerline and opposing said first portion, and wherein, after heating the connector, said first portion cools more slowly than said second portion, and thereby causes said hook member to deform such that the vertical centerline rotates with respect to the body of the connector.

* * * * *